US012770710B2

(12) United States Patent
Lee et al.

(10) Patent No.: US 12,770,710 B2
(45) **Date of Patent: *Oct. 20, 2026**

(54) METHOD OF ERROR CORRECTION CODE (ECC) DECODING AND MEMORY SYSTEM PERFORMING THE SAME

(71) Applicant: Samsung Electronics Co., Ltd., Suwon-si (KR)

(72) Inventors: Kangseok Lee, Suwon-si (KR); Geunyeong Yu, Suwon-si (KR); Seonghyeog Choi, Suwon-si (KR); Hongrak Son, Suwon-si (KR); Youngjun Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 63 days.

This patent is subject to a terminal disclaimer.

(21) Appl. No.: 18/790,881

(22) Filed: Jul. 31, 2024

(65) Prior Publication Data

US 2024/0395352 A1 Nov. 28, 2024

Related U.S. Application Data

(63) Continuation of application No. 17/854,638, filed on Jun. 30, 2022, now Pat. No. 12,080,366.

(30) Foreign Application Priority Data

Dec. 15, 2021 (KR) ........................ 10-2021-0179715

(51) Int. Cl.

| | |
|---|---|
| ***G11C 29/02*** | (2006.01) |
| ***G11C 29/52*** | (2006.01) |
| *G06F 11/10* | (2006.01) |

(52) U.S. Cl.
CPC ............ *G11C 29/52* (2013.01); *G11C 29/021* (2013.01); *G11C 29/022* (2013.01); *G06F 11/1048* (2013.01)

(58) Field of Classification Search
CPC ...... G11C 29/52; G11C 29/021; G11C 29/022
(Continued)

(56) References Cited

U.S. PATENT DOCUMENTS 8,904,263 B1 12/2014 Kumar et al.
8,924,824 B1 12/2014 Lu
(Continued)

OTHER PUBLICATIONS

Office Action in Korean Appln. No. 111125515, mailed on Nov. 27, 2025, 14 pages (with machine translation).
(Continued)

*Primary Examiner* — Ly D Pham
(74) *Attorney, Agent, or Firm* — Fish & Richardson P.C.

(57) ABSTRACT

In a method of error correction code (ECC) decoding, normal read data are read from a nonvolatile memory device based on normal read voltages, and a first ECC decoding is performed with respect to the normal read data. When the first ECC decoding results in failure, flip read data are read from the nonvolatile memory device based on flip read voltages corresponding to a flip range of a threshold voltage. Corrected read data are generated based on the flip read data by inverting error candidate bits included in the flip range among bits of the normal read data, and a second ECC decoding is performed with respect to the corrected read voltage. Error correction capability may be enhanced by retrying ECC decoding based on the corrected read data when ECC decoding based on the normal read data results in failure.

20 Claims, 32 Drawing Sheets

(58) Field of Classification Search
USPC .................................................... 365/185.09
See application file for complete search history.

(56) References Cited

U.S. PATENT DOCUMENTS

| | | | |
|---|---|---|---|
| 9,270,296 | B1 | 2/2016 | Nemati Anaraki et al. |
| 9,524,208 | B2 | 12/2016 | Kim et al. |
| 9,575,833 | B2 | 2/2017 | Jeon |
| 9,633,740 | B1 | 4/2017 | Alhussien et al. |
| 9,672,942 | B2 | 6/2017 | Yoon et al. |
| 9,680,504 | B2 | 6/2017 | Kim |
| 10,331,514 | B2 | 6/2019 | Kaynak et al. |
| 11,551,776 | B2 | 1/2023 | Kim et al. |
| 2013/0080858 | A1 | 3/2013 | Lee et al. |
| 2017/0097868 | A1 | 4/2017 | Kim et al. |
| 2017/0177436 | A1 | 6/2017 | Lee et al. |
| 2017/0230143 | A1* | 8/2017 | Regev ................. H04L 25/4915 |
| 2018/0074892 | A1 | 3/2018 | Shappir et al. |
| 2018/0076828 | A1 | 3/2018 | Kanno |
| 2018/0107540 | A1 | 4/2018 | Lee |
| 2019/0295659 | A1 | 9/2019 | Hong et al. |
| 2020/0169269 | A1* | 5/2020 | Kwak ................. G06F 11/1068 |
| 2021/0202012 | A1 | 7/2021 | Han et al. |
| 2022/0182073 | A1 | 6/2022 | Lee et al. |

OTHER PUBLICATIONS

European Search Report in European Appln. No. 22181528.5, mailed on Dec. 15, 2022, 15 pages.
Office Action in Taiwanese Appln. No. 111125515, mailed on Nov. 27, 2025, 14 pages (with machine translation).

* cited by examiner

BLKi

| | | |
|---|---|---|
| FR1 | FRh1 | VFh1 |
| FR2 | FRl1 | VFl1 |
| FR3 | FRh1+FRl1 | VFh1, VFl1 |
| FR4 | (FRh1+FRh2)+FRl1 | VFh2, VFl1 |
| FR5 | FRl1+(FRh1+FRh2) | VFh1, VFl2 |
| FR6 | (FRh1+FRh2)+(FRl1+FRl2) | VFh2, VFl2 |

FIG. 18

| | | | | |
|---|---|---|---|---|
| | ST | WK | WK | ST |
| RDATA → | 11 | 10 | 00 | 01 |
| LLR → | +4L | +2L | -2L | -4L |

| | | | | | | | | |
|---|---|---|---|---|---|---|---|---|
| 1 | 1 | 1 | 1 | 0 | 0 | 0 | 0 | HD |
| 1 | 0 | 0 | 0 | 0 | 0 | 0 | 0 | |
| 1 | 1 | 0 | 0 | 0 | 0 | 0 | 0 | |
| 1 | 1 | 1 | 0 | 0 | 0 | 0 | 0 | |
| 1 | 1 | 1 | 1 | 0 | 0 | 0 | 0 | |
| 1 | 1 | 1 | 1 | 1 | 0 | 0 | 0 | |
| 1 | 1 | 1 | 1 | 1 | 1 | 0 | 0 | |
| 1 | 1 | 1 | 1 | 1 | 1 | 1 | 0 | |
| 1 | 1 | 0 | 0 | 0 | 0 | 1 | 1 | SDH |
| 1 | 0 | 0 | 1 | 1 | 0 | 0 | 1 | SDL |
| 11 | 10 | 00 | 01 | 01 | 00 | 10 | 11 | SD |
| VST | ST | WK | VWK | VWK | WK | ST | VST | |

FIG. 20

| | | | | | | | |
|---|---|---|---|---|---|---|---|
| VST | ST | WK | VWK | VWK | WK | ST | VST |
| 111 | 110 | 100 | 101 | 001 | 000 | 010 | 011 |
| +7L | +5L | +3L | +L | -L | -3L | -5L | -7L |

$$S_{3\times5} = \begin{bmatrix} 2 & 3 & 110 & 142 & 165 \\ 5 & 64 & 96 & 113 & 144 \\ 7 & 50 & 75 & 116 & 174 \end{bmatrix}$$

| # | OFFSET |
|---|---|
| 1 | 0 |
| 2 | -50mV |
| 3 | +100mV |
| 4 | +50mV |
| ⋮ | ⋮ |

METHOD OF ERROR CORRECTION CODE (ECC) DECODING AND MEMORY SYSTEM PERFORMING THE SAME

CROSS-REFERENCE TO RELATED APPLICATION

This application is a continuation and claims priority U.S. patent application Ser. No. 17/854,638, filed Jun. 30, 2022 which claims priority under 35 USC § 119 to Korean Patent Application No. 10-2021-0179715, filed on Dec. 15, 2021 in the Korean Intellectual Property Office (KIPO), the disclosure of which are incorporated by reference herein in their entirety.

BACKGROUND

1. Technical Field

Example embodiments relate generally to semiconductor integrated circuits, and more particularly to a method of error correction code (ECC) decoding and a memory system which performs the method.

2. Discussion of the Related Art

Memory devices such as a flash memory device, a resistive memory device, etc., can store data in accordance with a plurality of threshold voltage distributions or a plurality of resistance distributions, where each respective threshold voltage distribution or resistance distribution is assigned to a corresponding logic state for stored data. The data stored by a memory cell may be read by determining whether the memory cell is turned ON/OFF when a predetermined read voltage is applied. During (and/or following) the programming of a memory cell, the intended threshold voltage distribution or resistance distribution of the memory cell may be undesirably distorted due to a number of events or conditions including, e.g., charge leakage, program disturbances, read disturbances, word and/or bitline coupling, temperature change, voltage change, degeneration of the memory cell, etc. For example, the intended threshold voltage distribution or resistance distribution may be shifted and/or broadened and cause a read fail such that wrong data different from the stored data are read out.

SUMMARY

Some example embodiments may provide a method of error correction code (ECC) decoding and a memory system which are capable of enhancing error correction capability.

According to example embodiments, a method of error correction code (ECC) decoding of a memory controller that controls a nonvolatile memory device includes reading normal read data from a nonvolatile memory device based on normal read voltages, and performing a first ECC decoding with respect to the normal read data. When the first ECC decoding results in failure, the method includes reading flip read data from the nonvolatile memory device based on flip read voltages corresponding to a flip range of a threshold voltage, generating corrected read data based on the flip read data by inverting error candidate bits included in the flip range among bits of the normal read data, and performing a second ECC decoding with respect to the corrected read voltage.

According to example embodiments, a method of error correction code (ECC) decoding of a memory controller that controls a nonvolatile memory device includes setting a flip range of a threshold voltage based on distribution data indicating degeneration degree of retention characteristics of the nonvolatile memory device, reading normal read data from a nonvolatile memory device based on normal read voltages, and performing a first ECC decoding with respect to the normal read data. When the first ECC decoding results in failure, the method includes reading flip read data from the nonvolatile memory device based on flip read voltages corresponding to the flip range, generating corrected read data based on the flip read data by inverting error candidate bits included in the flip range among bits of the normal read data, and performing a second ECC decoding with respect to the corrected read voltage.

According to example embodiments, a memory system includes a nonvolatile memory device and a memory controller configured to control operations of the nonvolatile memory device. The memory controller includes a data regenerator and an ECC decoder. When a first error correction code (ECC) decoding with respect to normal read data results in failure, the data regenerator generates corrected read data based on flip read data by inverting error candidate bits included in a flip range of a threshold voltage among bits of the normal read data, where the normal read data are read from the nonvolatile memory device based on normal read voltages, and the flip read data are read out from the nonvolatile memory device based on flip read voltages corresponding to the flip range. The ECC decoder performs the first ECC decoding with respect to the normal read data and performs a second ECC decoding with respect to the corrected read data when the first ECC decoding results in failure.

The method of ECC decoding and the memory system according to example embodiments may efficiently enhance error correction capability by retrying ECC decoding based on the corrected read data when ECC decoding based on the normal read data results in failure. The corrected read data are generated by inverting the values of the error candidate bits corresponding to the higher probability of errors. Through the enhanced error correction capability, reliability and performance of the nonvolatile memory device and the memory system may be enhanced.

BRIEF DESCRIPTION OF THE DRAWINGS

Example embodiments of the present disclosure will be more clearly understood from the following detailed description taken in conjunction with the accompanying drawings.

FIG. 18 is a diagram illustrating an example of a log likelihood ratio (LLR) corresponding to the 2-bit soft-decision read operation of FIG. 17.

FIG. 20 is a diagram illustrating an example of a log likelihood ratio (LLR) corresponding to the 3-bit soft-decision read operation of FIG. 19.

DETAILED DESCRIPTION OF THE EMBODIMENTS

Figure 1:
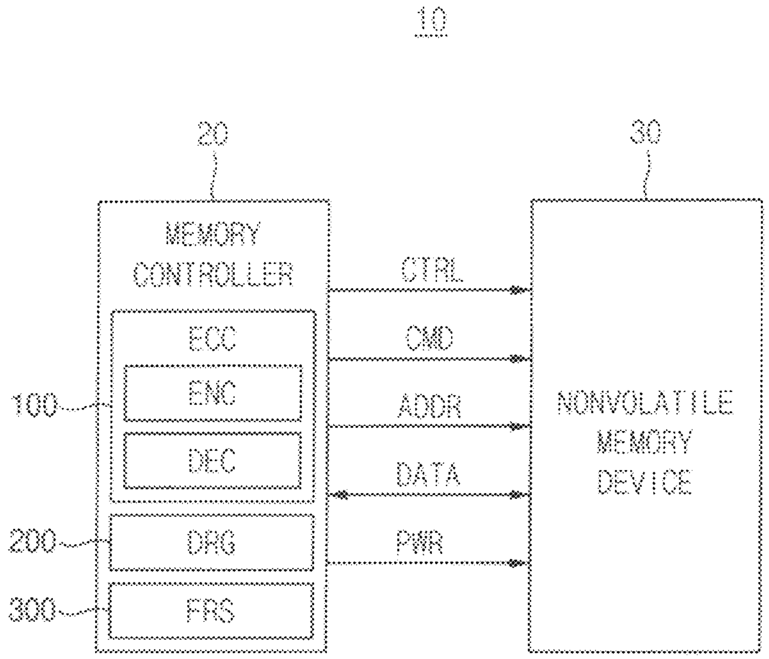
FIG. 1 is a block diagram illustrating a memory system according to example embodiments.

Various example embodiments will be described more fully hereinafter with reference to the accompanying drawings, in which some example embodiments are shown. In the drawings, like numerals refer to like elements throughout. The repeated descriptions may be omitted.

Figure 2:
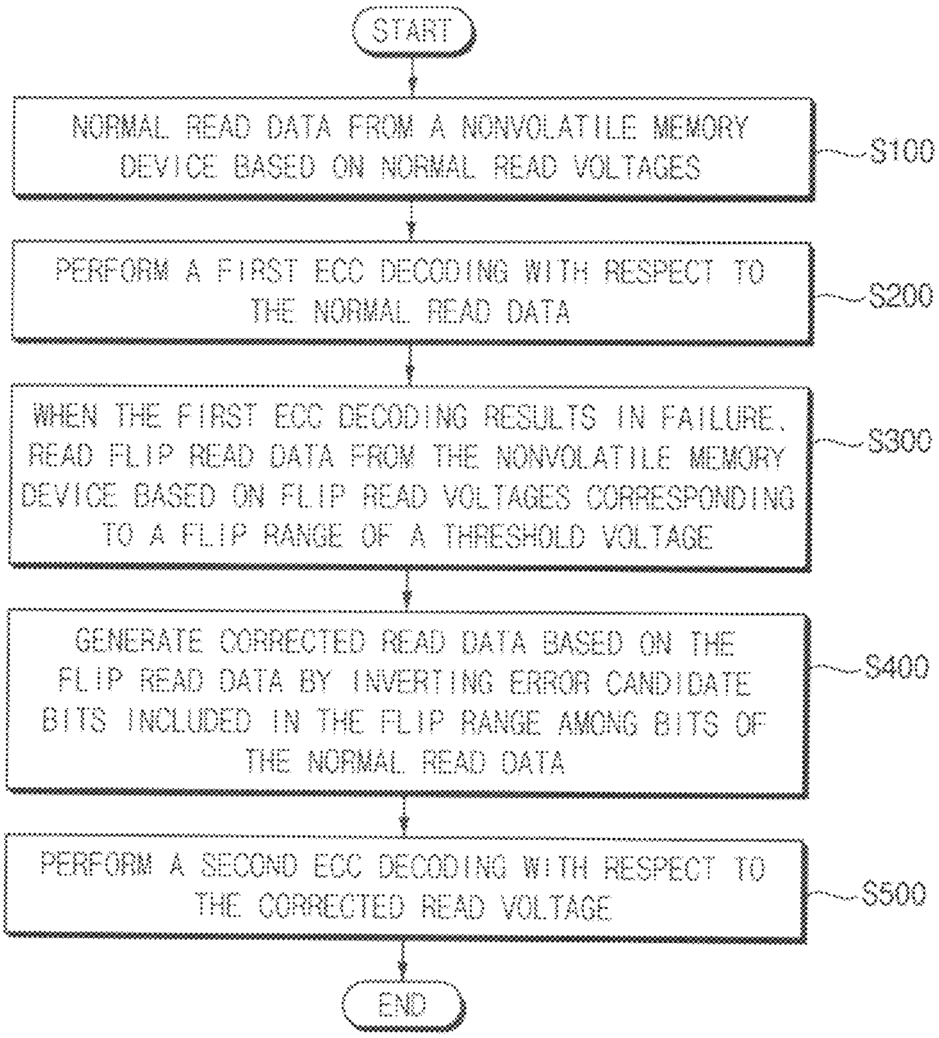
FIG. 2 is a flowchart illustrating a method of error correction code (ECC) decoding according to example embodiments.

FIG. 1 is a block diagram illustrating a memory system according to example embodiments. FIG. 2 is a flowchart illustrating a method of error correction code (ECC) decoding according to example embodiments.

Referring to FIG. 1, a memory system 10 may include a memory controller 20 and at least one instance of a nonvolatile memory device 30. The nonvolatile memory device 30 may be a nonvolatile memory device as described herein. The memory system 10 may include data storage media based on a flash memory such as, for example, a memory card, a universal serial bus (USB) memory and a solid state drive (SSD).

The nonvolatile memory device 30 may perform a read operation, an erase operation, and a program operation or a write operation under control of the memory controller 20. The nonvolatile memory device 30 receives a command CMD such as a read command and a write command, an address ADDR such as a read address and a write address, and data DATA through input/output lines from the memory controller 20 for performing such operations. In addition, the nonvolatile memory device 30 receives a control signal CTRL through a control line from the memory controller 20. In addition, the nonvolatile memory device 30 receives power PWR through a power line from the memory controller 20.

The memory controller 20 may include an ECC engine 100, a data regenerator 200 (DRG) and a flip range setter 300 (FRS).

The ECC engine 100 may include an ECC encoder ENC and an ECC decoder DEC. The ECC encoder ENC may perform ECC encoding with respect to write data to be programmed in the nonvolatile memory device 30 and generate encoded data, that is, a codeword. The ECC decoder DEC may perform ECC decoding with respect to read data or a codeword read from the nonvolatile memory device 30 and correct errors in the read data or codeword.

Referring to FIG. 1 and FIG. 2, the memory controller 20 may read normal read data from the nonvolatile memory device 30 based on normal read voltages (S100), and perform a first ECC decoding with respect to the normal read data (S200). The read operation of the nonvolatile memory device 30 under control of the memory controller 20 will be described below with reference to FIG. 3, FIG. 4 and FIG. 5. The ECC decoding will be described below with reference to FIG. 16, FIG. 22A, FIG. 22B, and so on.

Before proceeding, an introduction to several terms used herein may provide helpful context. Flip read data may be data that is read from the nonvolatile memory device 30 and which is flipped. Flipped data may be data in which the value of the bit(s) is/are flipped or reversed, such as from 0 to 1 or 1 to 0. Flip read data may be data of one or more bits stored at one or more memory cells in the nonvolatile memory device 30 and which is flipped. Flip read voltages may be voltages used to read the flip red data, such as when ECC decoding with respect to normal read data results in failure such that the normal read voltages used to read the normal read data are recognized as defective. Flip read data and flip read voltages are explained further, for example, with reference to the description of FIG. 6. FIG. 7, FIG. 8, FIG. 9 and FIG. 10 below. A flip range may refer to a range of a threshold voltage used for the flip read voltages. Flip ranges are explained further, for example, with reference to the description of FIG. 13 and FIG. 14 below.

When the first ECC decoding results in failure, the memory controller 20 may read flip read data from the nonvolatile memory device 30 based on flip read voltages corresponding to a flip range of a threshold voltage (S300). In some example embodiments, the flip range setter 300 may set the flip range based on distribution data indicating degeneration degree of retention characteristics of the nonvolatile memory device 30. A method of error correction code decoding may include setting the flip range based on distribution data in this manner. As will be described below with reference to FIG. 24, the distribution data may be cell count information.

The data regenerator 200 may generate corrected read data based on the flip read data by inverting error candidate bits included in the flip range among bits of the normal read data (S400).

In some example embodiments, as will be described below with reference to FIG. 6, FIG. 7, FIG. 8, FIG. 9, FIG. 10, FIG. 11, FIG. 12, FIG. 13, FIG. 14, and FIG. 15, the normal read data may include hard-decision data that are read based on a hard-decision read voltage included in the normal read voltages and indicate data stored in the nonvolatile memory device. In this case, the data regenerator 200 may generate corrected hard-decision data based on the flip read data by inverting the error candidate bits included in the flip range among bits of the hard-decision data.

In some example embodiments, as will be described below with reference to FIG. 17, FIG. 18, FIG. 19, FIG. 20 and FIG. 21, the normal read data may further include soft-decision data that are read based on soft-decision read voltages included in the normal read voltages and indicate reliability of the hard-decision data. In this case, the data regenerator 200 may generate corrected soft-decision data based on the flip read data by inverting the error candidate bits included in the flip range among bits of the soft-decision data.

The ECC decoder DEC may perform a second ECC decoding with respect to the corrected read voltage. In other words, the ECC decoder DEC may perform a second hard-decision decoding with respect to the corrected hard-decision data again when a first hard-decision decoding with respect to the hard-decision data results in failure. Also, or alternatively, the ECC decoder DEC may perform a second soft-decision decoding with respect to the corrected soft-decision data again when a first soft-decision decoding with respect to the soft-decision data results in failure.

In some example embodiments, as will be described below with reference to FIG. 13, FIG. 14, and FIG. 15, the flip range setter 300 may set a plurality of flip ranges based on distribution data indicating degeneration degree of retention characteristics of the nonvolatile memory device 30. The data regenerator 200 may sequentially generate each of a plurality of corrected data respectively corresponding to the plurality of flip ranges, and the ECC decoder DEC may sequentially perform the second ECC decoding with respect to each of the plurality of corrected data, until the second ECC decoding with respect to one of the plurality of corrected data results in success.

As such, the method of ECC decoding and the memory system according to example embodiments may efficiently enhance error correction capability by retrying ECC decoding based on the corrected read data when ECC decoding based on the normal read data results in failure. The corrected read data may be generated by inverting the values of the error candidate bits corresponding to the higher probability of errors. Through the enhanced error correction capability, reliability and performance of the nonvolatile memory device and the memory system may be enhanced.

Figure 3:
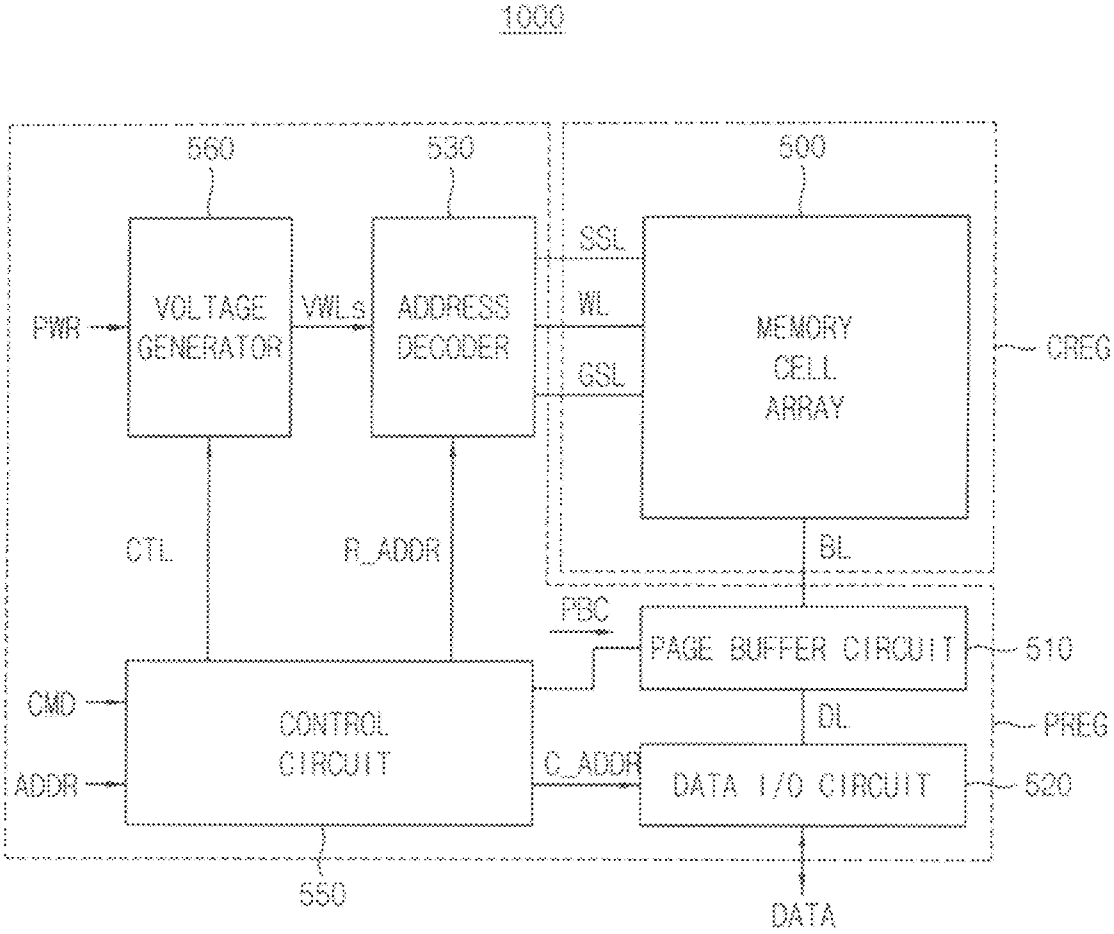
FIG. 3 is a block diagram illustrating a nonvolatile memory device according to example embodiments.

FIG. 3 is a block diagram illustrating a nonvolatile memory device according to example embodiments.

Referring to FIG. 3, a nonvolatile memory device 1000 may include a memory cell array 500, a page buffer circuit 510, a data I/O circuit 520 (input/output circuit), an address decoder 530, a control circuit 550 and a voltage generator 560. The memory cell array 500 may be disposed in the cell region CREG in FIG. 36. The page buffer circuit 510, the data I/O circuit 520, the address decoder 530, the control circuit 550 and the voltage generator 560 may be disposed in the peripheral region PREG in FIG. 36.

The memory cell array 500 may be coupled to the address decoder 530 through string selection lines SSL, wordlines WL, and ground selection lines GSL. In addition, the memory cell array 500 may be coupled to the page buffer circuit 510 through bitlines BL. The memory cell array 500 may include memory cells coupled to the wordlines WL and the bitlines BL. In some example embodiments, the memory cell array 500 may be a three-dimensional memory cell array, which is formed on a substrate in a three-dimensional structure (for example, a vertical structure). In this case, the memory cell array 500 may include cell strings (e.g., NAND strings) that are vertically oriented such that at least one memory cell is overlapped vertically with another memory cell.

The control circuit 550 may receive a command (signal) CMD and an address (signal) ADDR from a memory controller. Accordingly, the control circuit 550 may control erase, program and read operations of the nonvolatile memory device 1000 in response to (or based on) at least one of the command signal CMD and the address signal ADDR. An erase operation may include performing a sequence of erase loops. A program operation may include performing a sequence of program loops. Each program loop may include a program operation and a program verification operation. Each erase loop may include an erase operation and an erase verification operation. The read operation may include a normal read operation and a data recover read operation.

For example, the control circuit 550 may generate the control signals CTL used to control the operation of the voltage generator 560. The control circuit 550 may also generate the page buffer control signal PBC for controlling the page buffer circuit 510 based on the command signal CMD, and generate the row address R_ADDR and the column address C_ADDR based on the address signal ADDR. The control circuit 550 may provide the row address R_ADDR to the address decoder 530 and provide the column address C_ADDR to the data I/O circuit 520.

The address decoder 530 may be coupled to the memory cell array 500 through the string selection lines SSL, the wordlines WL, and the ground selection lines GSL. During the program operation or the read operation, the address decoder 530 may determine or select one of the wordlines WL as a selected wordline and determine the remaining wordlines WL except for the selected wordline as unselected wordlines based on the row address R_ADDR.

During the program operation or the read operation, the address decoder 530 may determine one of the string selection lines SSL as a selected string selection line and determine the remaining string selection lines SSL except for the selected string selection line as unselected string selection lines based on the row address R_ADDR.

The voltage generator 560 may generate wordline voltages VWL, which are required for the operation of the memory cell array 500 of the nonvolatile memory device 1000, based on the control signals CTL. The voltage generator 560 may receive power PWR from a memory controller such as the memory controller 20 in FIG. 1. The wordline voltages VWL may be applied to the wordlines WL through the address decoder 530.

For example, during the erase operation, the voltage generator 560 may apply an erase voltage to a well and/or a common source line of a memory block and apply an erase permission voltage (e.g., a ground voltage) to all or a portion of the wordlines of the memory block based on an erase address. During the erase verification operation, the voltage generator 560 may apply an erase verification voltage simultaneously to all of the wordlines of the memory block or sequentially (e.g., one by one) to the wordlines.

For example, during the program operation, the voltage generator 560 may apply a program voltage to the selected wordline and may apply a program pass voltage to the unselected wordlines. In addition, during the program verification operation, the voltage generator 560 may apply a program verification voltage to the first wordline and may apply a verification pass voltage to the unselected wordlines.

During the normal read operation, the voltage generator 560 may apply a read voltage to the selected wordline and may apply a read pass voltage to the unselected wordlines. During the data recover read operation, the voltage generator 560 may apply the read voltage to a wordline adjacent to the selected wordline and may apply a recover read voltage to the selected wordline.

The page buffer circuit 510 may be coupled to the memory cell array 500 through the bitlines BL. The page buffer circuit 510 may include multiple buffers. In some example embodiments, each buffer may be connected to a single bitline. In other example embodiments, each buffer may be connected to two or more bitlines. The page buffer circuit 510 may temporarily store data to be programmed in a selected page or data read out from the selected page of the memory cell array 500.

The data I/O circuit 520 may be coupled to the page buffer circuit 510 through data lines DL. During the program operation, the data I/O circuit 520 may receive program data DATA received from the memory controller and provide the program data DATA to the page buffer circuit 510 based on the column address C_ADDR received from the control circuit 550. During the read operation, the data I/O circuit 520 may provide read data DATA, having been read from the memory cell array 500 and stored in the page buffer circuit 510, to the memory controller based on the column address C_ADDR received from the control circuit 550.

In addition, the page buffer circuit 510 and the data I/O circuit 520 may read data from a first area of the memory cell array 500 and write the read data to a second area of the memory cell array 500 (e.g., without transmitting the data to a source external to the nonvolatile memory device 1000, such as to the memory controller). For example, the page buffer circuit 510 and the data I/O circuit 520 may perform a copy-back operation.

Figure 4:
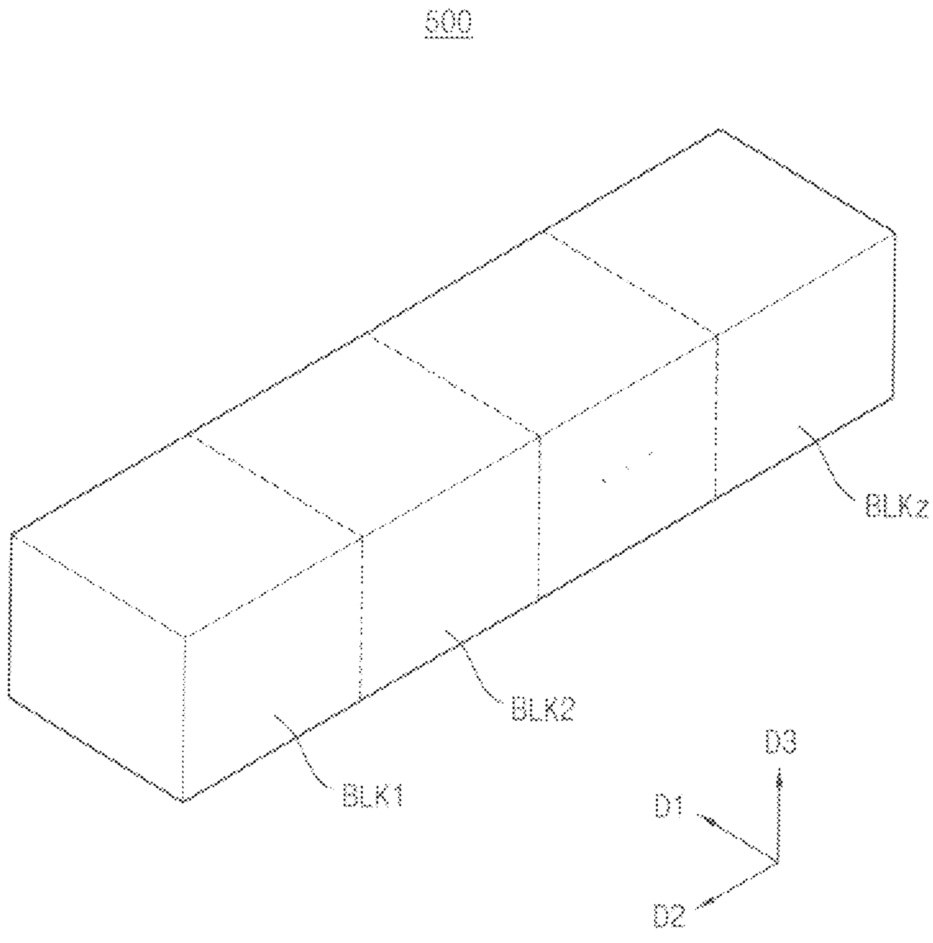
FIG. 4 is a block diagram illustrating a memory cell array included in the nonvolatile memory device of FIG. 3.
Figure 5:
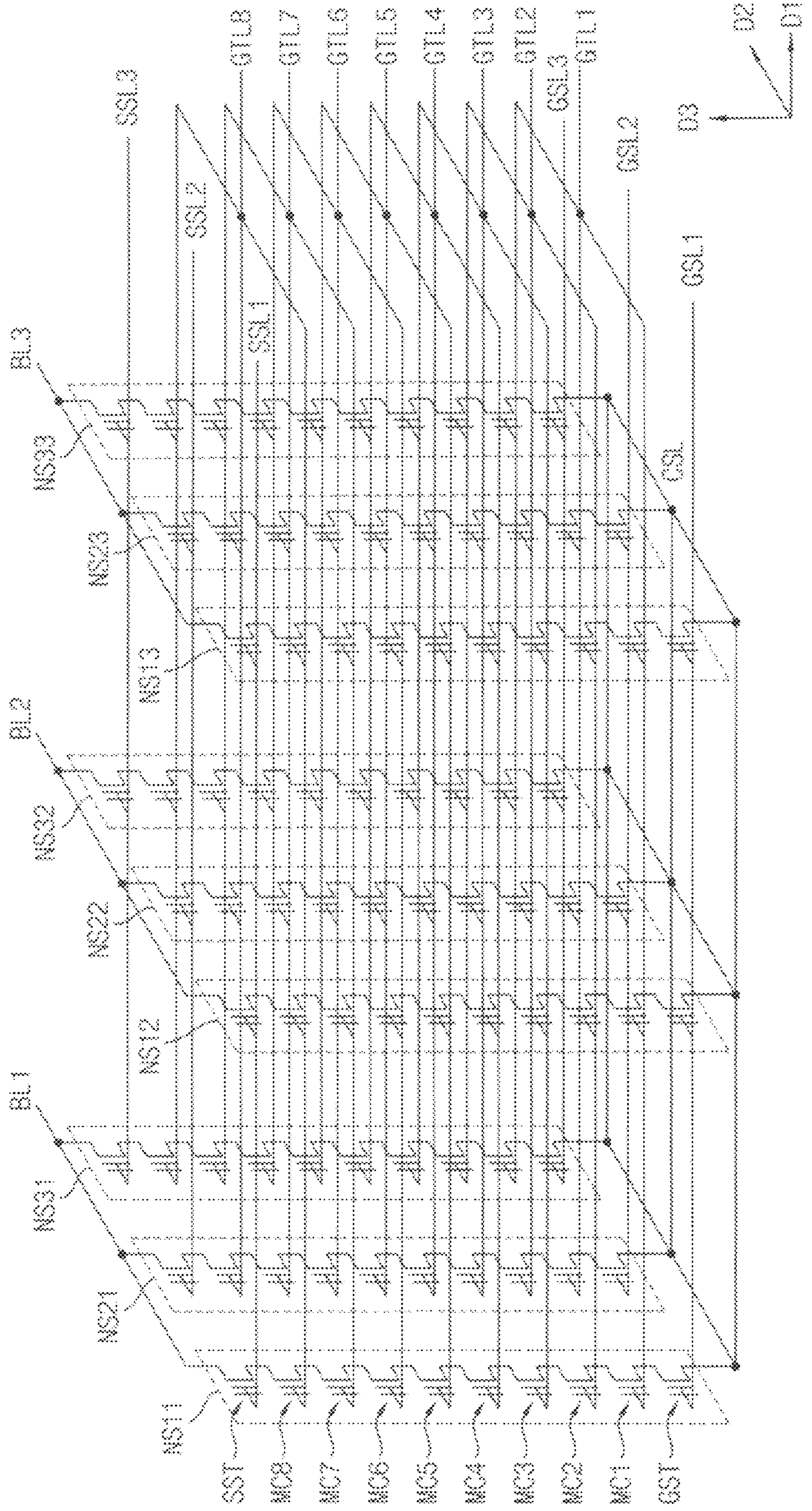
FIG. 5 is a circuit diagram illustrating an equivalent circuit of a memory block included in the memory cell array of FIG. 4.

FIG. 4 is a block diagram illustrating a memory cell array included in the nonvolatile memory device of FIG. 3. FIG. 5 is a circuit diagram illustrating an equivalent circuit of a memory block included in the memory cell array of FIG. 4.

Referring to FIG. 4, the memory cell array 500 may include memory blocks BLK1 to BLKz. In some example embodiments, the memory blocks BLK1 to BLKz may be selected by the address decoder 430 in FIG. 3. For example, the address decoder 430 may select a particular memory block BLK among the memory blocks BLK1 to BLKz corresponding to a block address.

The memory block BLKi of FIG. 5 may be formed on a substrate in a three-dimensional structure (for example, a vertical structure). For example, NAND strings or cell strings included in the memory block BLKi may be disposed in the vertical direction D3 perpendicular to the upper surface of the substrate.

Referring to FIG. 5, the memory block BLKi may include cell strings or NAND strings NS11 to NS33 coupled between bitlines BL1, BL2 and BL3 and a common source line CSL. Each NAND string may include a plurality of memory cells stacked in the vertical direction D3, and the plurality of wordlines may be stacked in the vertical direction D3.

Each of the NAND strings NS11 to NS33 may include a string selection transistor SST, memory cells MCi to MC8, and a ground selection transistor GST. In FIG. 5, each of the NAND strings NS11 to NS33 is illustrated to include eight memory cells MCi to MC8. However, embodiments are not limited thereto. In some embodiments, each of the NAND strings NS11 to NS33 may include any number of memory cells.

Each string selection transistor SST may be connected to a corresponding string selection line (for example, one of SSL1 to SSL3). The memory cells MCi to MC8 may be connected to corresponding gate lines GTL1 to GTL8, respectively. The gate lines GTL1 to GTL8 may be wordlines. Some of the gate lines GTL1 to GTL8 may be dummy wordlines. Each ground selection transistor GST may be connected to a corresponding ground selection line (for example, one of GSL1 to GSL3). Each string selection transistor SST may be connected to a corresponding bitline (e.g., one of BL1, BL2 and BL3). Each ground selection transistor GST may be connected to the common source line CSL.

The Wordline (each of the gate lines GT11 to GTL8) having the same height may be commonly connected. The ground selection lines GSL1 to GSL3 and the string selection lines SSL1 to SSL3 may be separated. In FIG. 5, the memory block BLKi is illustrated to be coupled to eight gate lines GTL1 to GTL8 and three bitlines BL1 to BL3. However, example embodiments are not limited thereto. Each memory block in the memory cell array 500 may be coupled to any number of wordlines and any number of bitlines.

Figure 6:
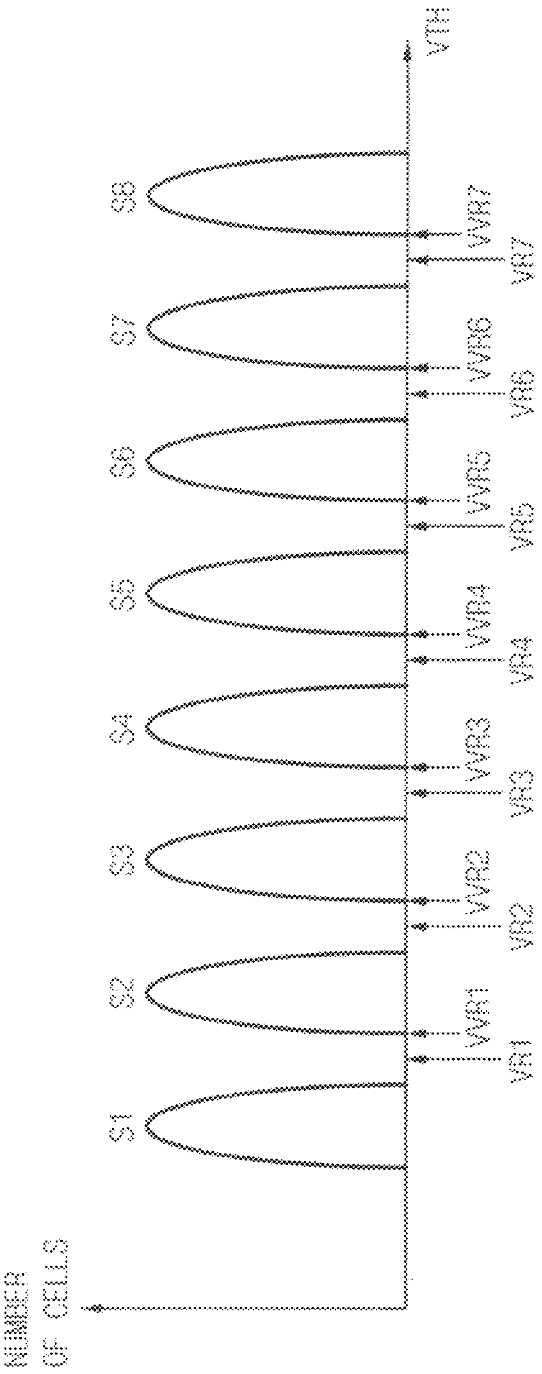
FIG. 6 is a diagram illustrating example states of multi-level cells included in a nonvolatile memory device according to example embodiments.

FIG. 6 is a diagram illustrating example states of multi-level cells included in a nonvolatile memory device according to example embodiments.

FIG. 6 illustrates first through eighth states S1~S8 of a triple level cell (TLC) memory where each memory cell of the TLC memory may store three data bits. In FIG. 6, the horizontal axis represents a threshold voltage VTH of memory cells and the vertical axis represents the number of the memory cells corresponding to the threshold voltage VTH. During the program operation, the program success of the first through eighth states S1~S8 may be distinguished by respectively applying first through seventh verification read voltage VVR1~VVR7 to the selected wordline. In addition, during the normal read operation, the first through eighth states S1~S8 may be distinguished by applying at least a portion of first through seventh normal read voltages VR1~VR7 corresponding to hard-decision read voltages to the selected wordline.

Figure 7:
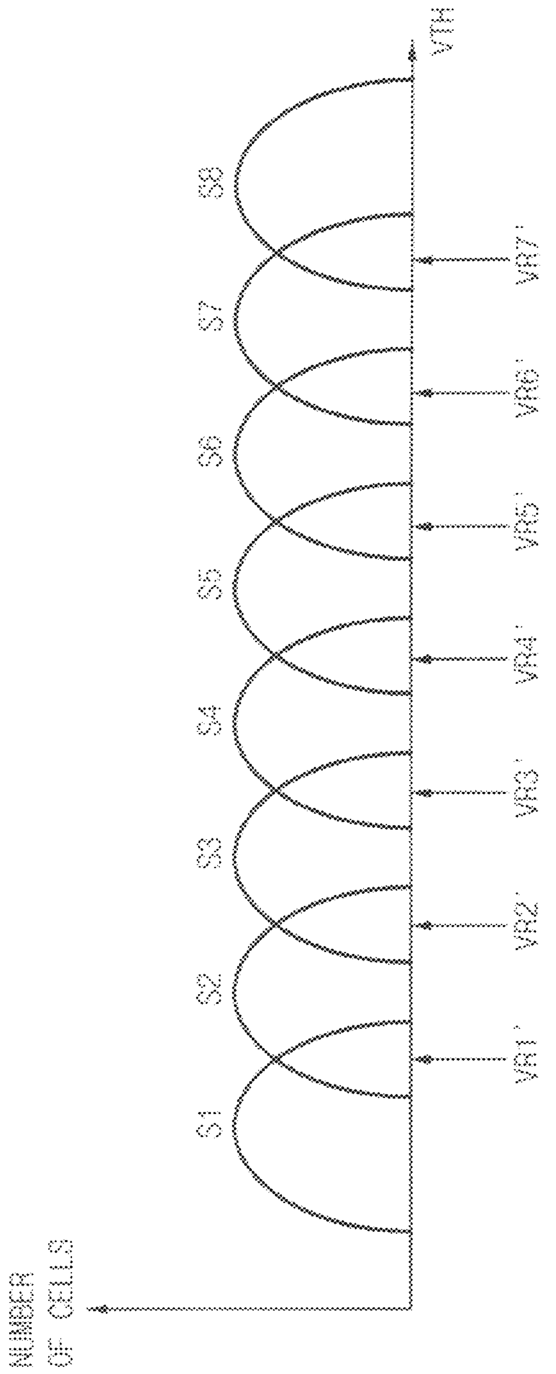
FIG. 7 is a diagram illustrating degenerated states from the states of FIG. 6.

FIG. 7 is a diagram illustrating degenerated states from the states of FIG. 6.

The threshold voltage distributions with respect to the states S1~S8 of FIG. 6 may be degenerated as illustrated in FIG. 7. During or after programming of memory cells, the intended distributions may be undesirably distorted due to a number of events or conditions including (e.g.,) charge leakage, program disturbances, read disturbances, wordline and/or bitline coupling, temperature change, voltage change, degeneration of the memory cells, etc. For example, the intended distributions may be shifted and/or broadened. According to the degeneration degree of the memory cells, the read operation based on the read voltages VR1~VR7 in FIG. 6 may cause a read fail such that wrong data different from the stored data are read out. When the read fail occurs, the nonvolatile memory device may perform a recovery read operation such that the optimal read voltages VR1'~VR7' as illustrated in FIG. 7 are searched to try another read operation based on the optimal read voltages VR1'~VR7'. However, if the degeneration degree is serious, it may be impossible to discern the states S1~S7 even by the optimal read voltages VR1'~VR7'. In addition, obtaining the optimal read voltages VR1'~VR7' may take a long time, thereby degrading the performance of the memory system.

According to example embodiments, the correction probability may be increased by retrying the ECC decoding based on the corrected read data that are obtained by inverting the error candidate bits having high probability of errors.

Figure 8:
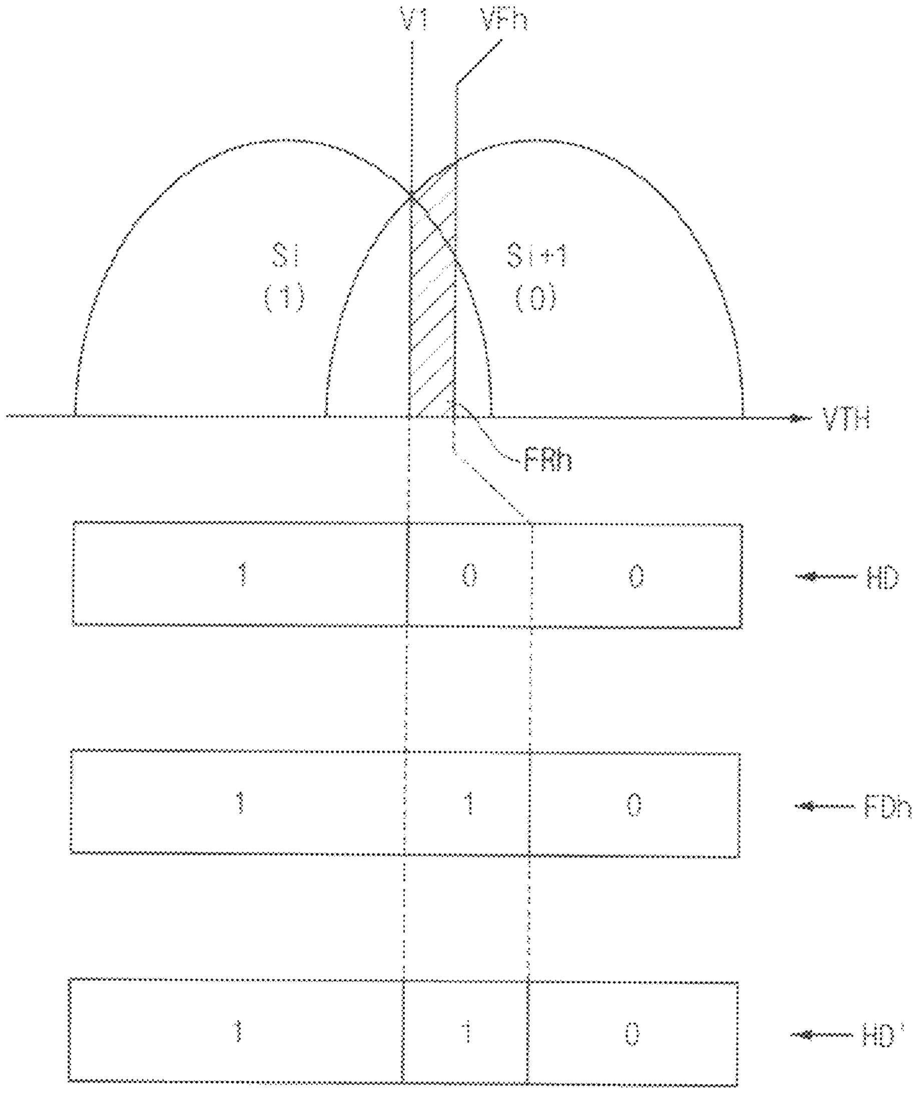
FIG. 8, FIG. 9 and FIG. 10 are diagrams illustrating example embodiments of generating corrected read data in a method of ECC decoding according to example embodiments.
Figure 9:
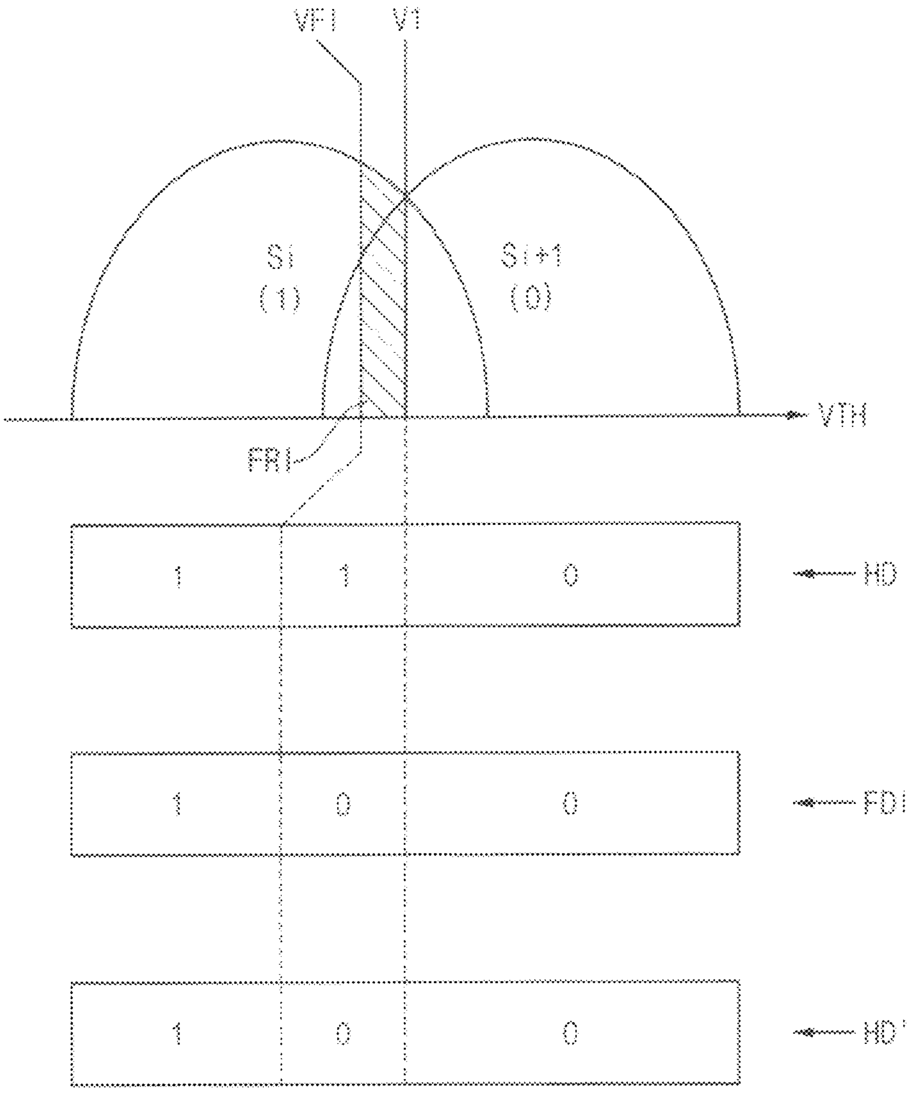
Figure 10:
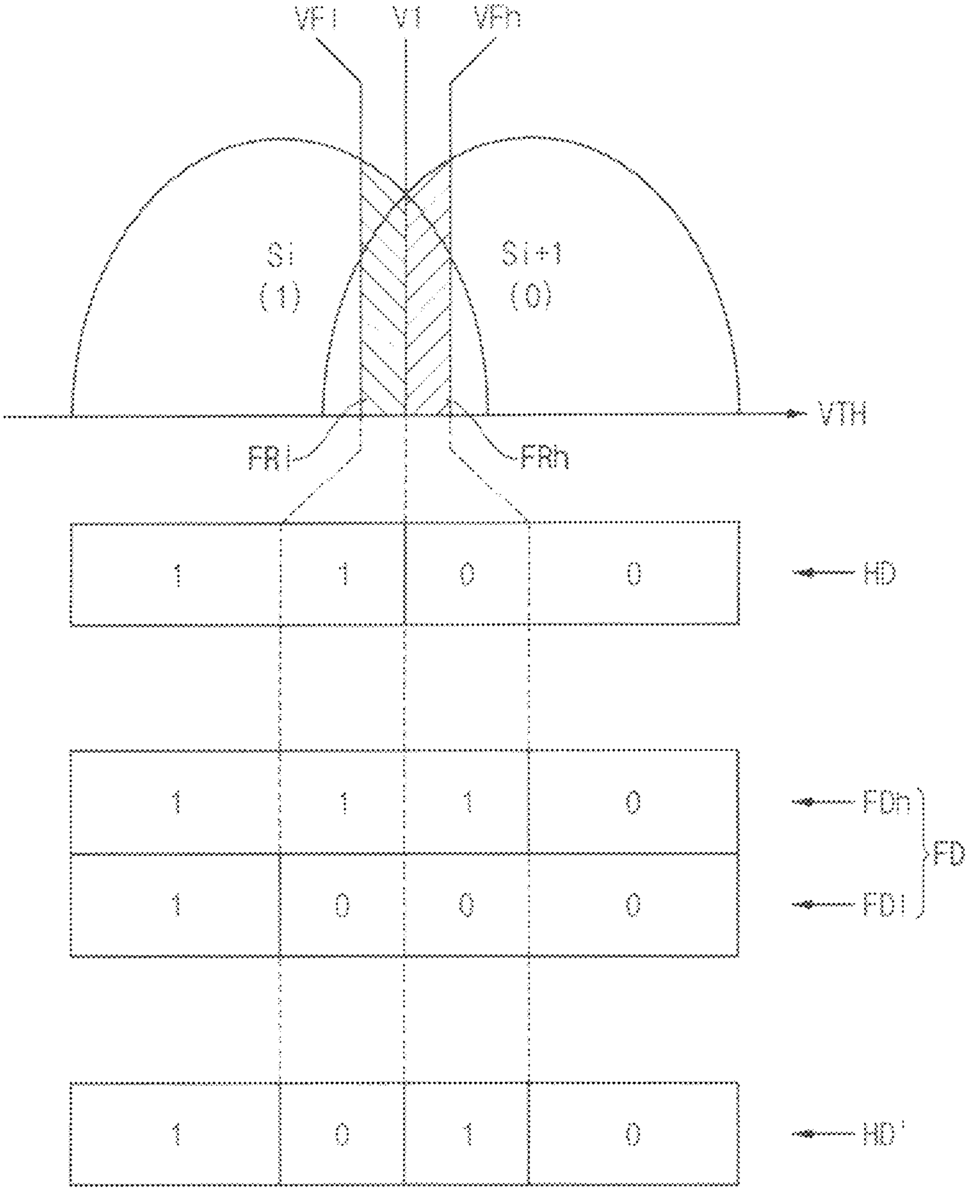

FIG. 8, FIG. 9 and FIG. 10 are diagrams illustrating example embodiments of generating corrected read data in a method of ECC decoding according to example embodiments.

FIG. 8, FIG. 9 and FIG. 10 illustrate the hard-decision data HD corresponding to the normal read data, the flip read data FD and the corrected hard-decision data HD', with respect to the two adjacent threshold voltage distributions or the states Si and Si+1. The first state Si corresponding to a data bit of "1" and the second state Si+1 corresponding to a data bit of "0" may be discerned based on the hard-decision data HD, but the hard-decision data HD may include error bits because the threshold voltages of the memory cells may be changed due to various factors. The error bits of the hard-decision data HD may be corrected by performing the ECC decoding.

Referring to FIG. 1, FIG. 2, FIG. 3, FIG. 4, FIG. 5, FIG. 6, FIG. 7 and FIG. 8, when the ECC decoding with respect to the hard-decision data HD results in failure, the memory controller 20 may read high flip read data FDh based on a high flip read voltage VFh higher than the hard-decision read voltage V1. As such, a method of error correction code decoding may include reading flip read data from a nonvolatile memory device, and reading the flip read data may include reading high flip read data in this manner. As will be described below with reference to FIG. 11 and FIG. 12, the data regenerator 200 may perform a bitwise logic operation on the hard-decision data HD and the high flip read data FDh. The data regenerator 200 may invert the error candidate bits to generate the corrected hard-decision data HD', where the error candidate bits are included in the high flip range FRh between the hard-decision read voltage V1 and the high flip read voltage VFh.

Referring to FIG. 1 and FIG. 9, when the ECC decoding with respect to the hard-decision data HD results in failure, the memory controller 20 may read low flip read data FD1 based on a low flip read voltage VF1 lower than the hard-decision read voltage V1. As such, a method of error correction code decoding may include reading flip read data from a nonvolatile memory device, and reading the flip read data may include reading low flip read data in this manner. As will be described below with reference to FIG. 11 and FIG. 12, the data regenerator 200 may perform a bitwise logic operation on the hard-decision data HD and the low flip read data FD1. The data regenerator 200 may invert the error candidate bits to generate the corrected hard-decision data HD', where the error candidate bits are included in the low flip range FR1 between the hard-decision read voltage V1 and the low flip read voltage VF1.

Referring to FIG. 1 and FIG. 10, when the ECC decoding with respect to the hard-decision data HD results in failure, the memory controller 20 may read high flip read data FDh based on a high flip read voltage VFh higher than the hard-decision read voltage V1, and read low flip read data FD1 based on a low flip read voltage VF1 lower than the hard-decision read voltage V1. As will be described below with reference to FIG. 11 and FIG. 12, the data regenerator 200 may perform a first bitwise logic operation on the hard-decision data HD and the high flip read data FDh and a second bitwise logic operation on the hard-decision data HD and the low flip read data FD1. The data regenerator 200 may invert the error candidate bits to generate the corrected hard-decision data HD', where the error candidate bits are included in a high flip range FRh between the hard-decision read voltage V1 and the high flip read voltage VFh and a low flip range FR1 between the hard-decision read voltage V1 and the low flip read voltage VF1.

The flip range setter 300 of FIG. 1 may set the high flip read voltage VFh and the low flip read voltage VF1 based on distribution data indicating degeneration degree of retention characteristics of the nonvolatile memory device 30. As such, a method of error correction code decoding may include setting the flip read data and the low flip read data in this manner. Accordingly, the high flip range FRh corresponding to the high flip read voltage VFh and the low flip range FR1 corresponding to the low flip read voltage VF1 may be determined.

In some example embodiments, the data regenerator 200 may generate the corrected hard-decision data HD' based on a following bitwise logic operation in Expression 1.

$$HD'[i] = HD[i] XOR \sim FD[i] \quad \text{Expression 1}$$

In Expression 1, HD'[i] indicates each bit of the corrected hard-decision data, HD[i] indicates each bit of the hard-decision data, FD[i] indicates each bit of the flip read data, "XOR" indicates an exclusive OR logic operation, and "~" indicates an inversion logic operation.

Figure 11:
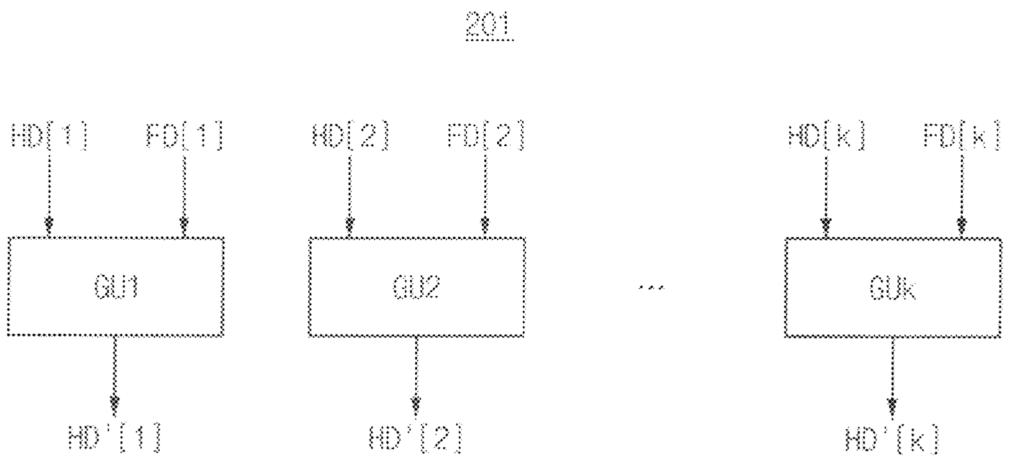
FIG. 11 is a diagram illustrating an example embodiment of a data regenerator included in a memory controller according to example embodiments.
Figure 12:
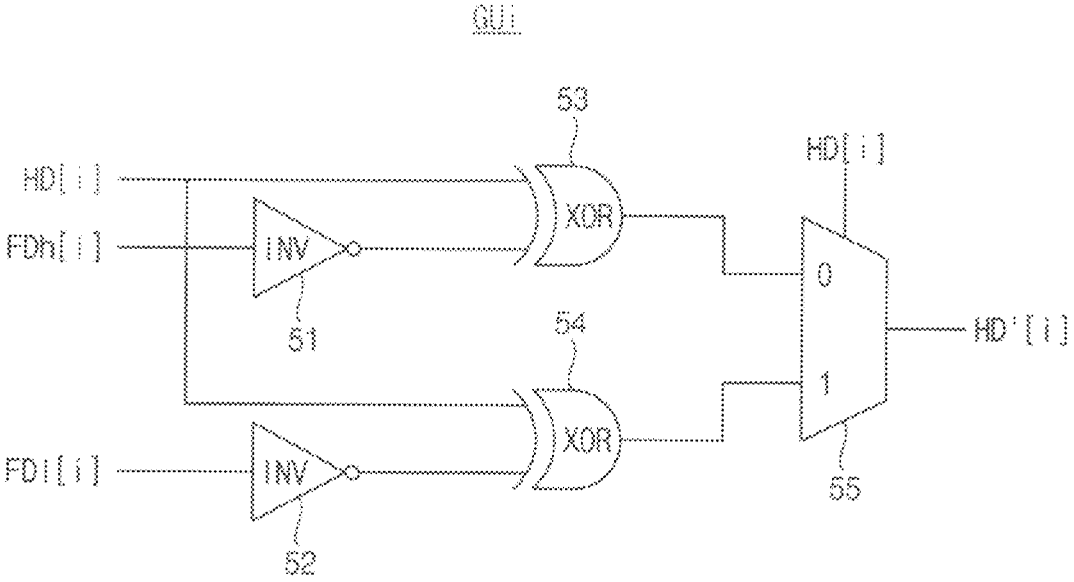
FIG. 12 is a diagram illustrating an example embodiment of a unit circuit included in the data regenerator of FIG. 11.

FIG. 11 is a diagram illustrating an example embodiment of a data regenerator included in a memory controller according to example embodiments. FIG. 12 is a diagram illustrating an example embodiment of a unit circuit included in the data regenerator of FIG. 11.

Referring to FIG. 11, the data regenerator 201 may include a plurality of unit circuits, for example, firth through k-th unit circuits GU1~GUk, which are configured to perform a bitwise logic operation to generate the corrected read data HD'.

The first unit circuit GU1 may perform a logic operation on the first bit HD[1] of the hard-decision data HD and the first bit FD[1] of the flip read data FD to generate the first bit HD'[1] of the corrected hard-decision data HD'. The second unit circuit GU2 may perform the logic operation on the second bit HD[2] of the hard-decision data HD and the second bit FD[2] of the flip read data FD to generate the second bit HD'[2] of the corrected hard-decision data HD'. As such, the last unit circuit, that is, the k-th unit circuit GUk may perform the logic operation on the k-th bit HD[k] of the hard-decision data HD and the k-th bit FD[k] of the flip read data FD to generate the k-th bit HD'[k] of the corrected hard-decision data HD'.

FIG. 12 illustrates one unit circuit GUi and the first through k-th unit circuits GU1~GUk in FIG. 11 may have the same configuration.

Referring to FIG. 12, the unit circuit GUi may include inverter 51 (INV) and inverter 52 (INV), XOR logic gates 53 and 54 and a multiplexer 55. The inverter 51 may invert each bit FDh[i] of the high flip read data FDh. The XOR logic gate 53 may perform an XOR operation on the output of the inverter 51 and each bit HD[i] of the hard-decision data HD. The inverter 52 may invert each bit FD1[*i*] of the low flip read data FD1. The XOR logic gate 54 may perform an XOR operation on the output of the inverter 52 and each bit HD[i] of the hard-decision data HD. The multiplexer 55 may select one of the outputs of the XOR logic gates 53 and 54 based on each bit HD[i] of the hard-decision data HD and output each bit HD'[i] of the corrected hard-decision data HD'[i].

Example configurations to generate the corrected hard-decision data HD' are described with reference to FIG. 11 and FIG. 12, but example embodiments are not limited thereto. For example, the data regenerator may further include circuit elements to generate the corrected soft-decision data.

Figures 13, 14:
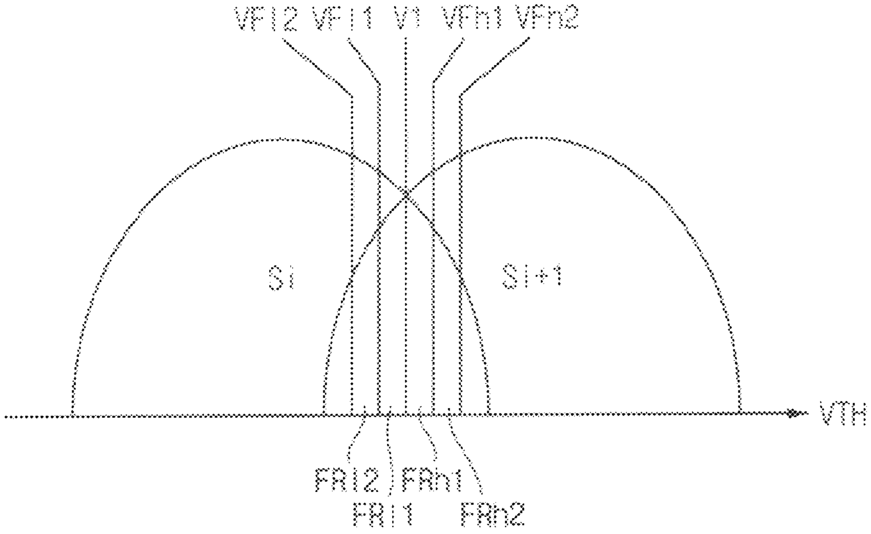
FIG. 13 and FIG. 14 are diagrams illustrating an example embodiment of setting a flip range in a method of ECC decoding according to example embodiments.

FIG. 13 and FIG. 14 are diagrams illustrating an example embodiment of setting a flip range in a method of ECC decoding according to example embodiments.

Referring to FIG. 1, FIG. 13 and FIG. 14, the flip range setter 300 may set a plurality of flip ranges, for example, first through sixth flip ranges FR1~FR6, based on distribution data indicating degeneration degree of retention characteristics of the nonvolatile memory device 30. In this case, the flip read voltages may include high flip read voltage VFh1 and VFh2 corresponding to the high flip ranges FRh1 and FRh2, and low flip read voltage VF11 and VF12 corresponding to the low flip ranges FR11 and FR12.

For example, as illustrated in FIG. 14, the first flip range FR1 may correspond to the threshold voltage range between the hard-decision read voltage V1 and the high flip read voltage VFh1, the second flip range FR2 may correspond to the threshold voltage range between the hard-decision read voltage V1 and the low flip read voltage VF11, the third flip range FR3 may correspond to the threshold voltage range between the low flip read voltage VF11 and the high flip read voltage VFh1, the fourth flip range FR4 may correspond to the threshold voltage range between the low flip read voltage VF11 and the high flip read voltage VFh2, the fifth flip range FR5 may correspond to the threshold voltage range between the low flip read voltage VF12 and the high flip read voltage VFh1, and the sixth flip range FR6 may correspond to the threshold voltage range between the low flip read voltage VF12 and the high flip read voltage VFh2. As such, the plurality of flip ranges FR1-FR6 may be set such that the first flip range FR1 may include the smallest number of the error candidate bits to be flipped and the sixth flip range FR6 may include the largest number of the error candidate bits to be flipped. This will be true when, for example, the first flip range FR1 has fewer error candidate bits to be flipped than the second flip range FR2. In other words, the number of the error candidate bits in the (i+1)-th flip range FRi+1 may be larger than the number of the error candidate bits in the i-th flip range FRi.

After the plurality of flip ranges are set as described above, the generation of the corrected read data and the ECC decoding based on the corrected read data may be performed repeatedly by increasing the number of the error candidate bits, until the ECC encoding results in success, as will be described below with reference to FIG. 15.

Figure 15:
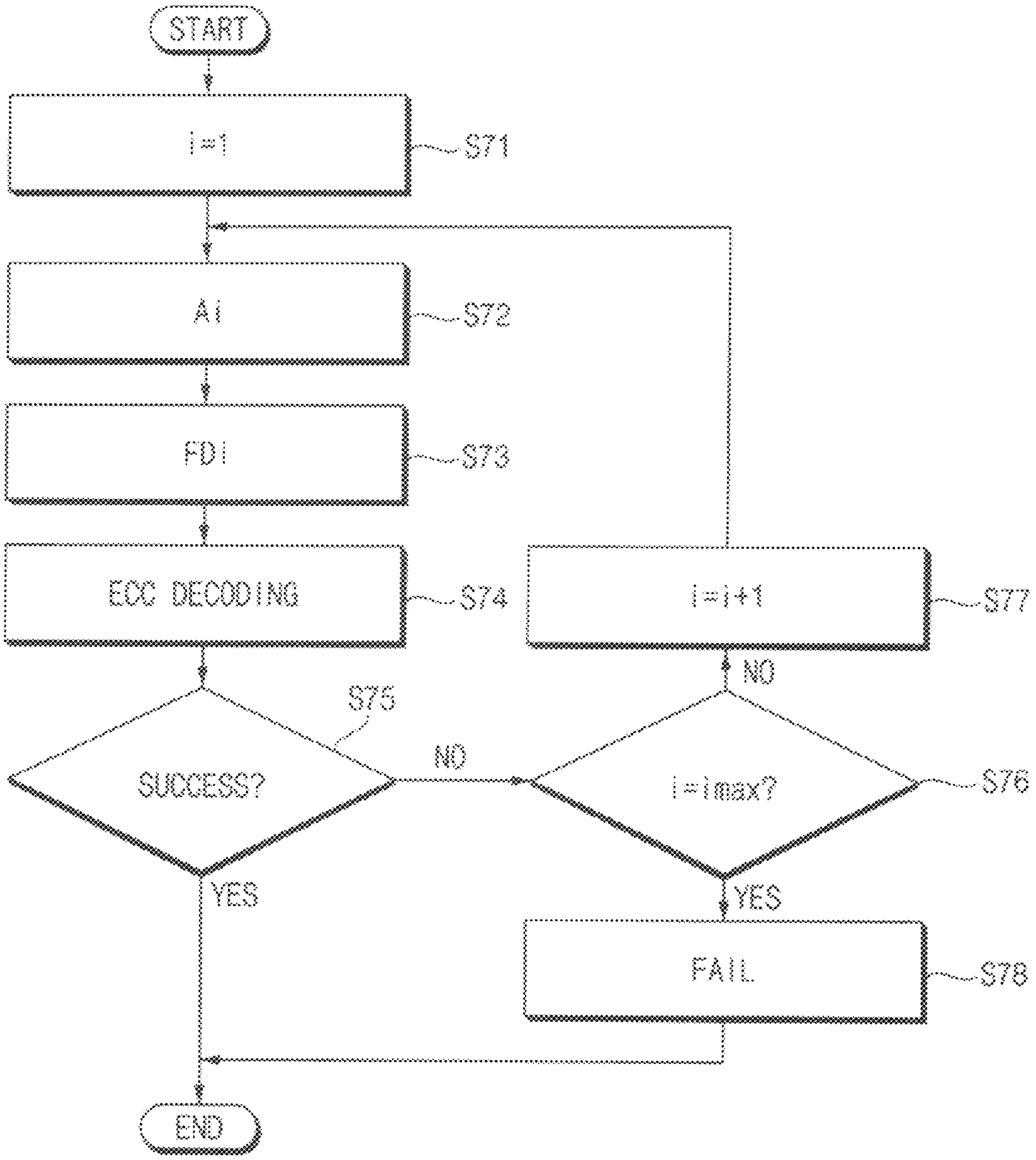
FIG. 15 is a flowchart illustrating a method of ECC decoding according to example embodiments.

FIG. 15 is a flowchart illustrating a method of ECC decoding according to example embodiments.

Referring to FIG. 15, an index i indicating the flip range is initialized to 1 (S71). The i-th flip range Ai is selected (S72), flip read data FDi are read from the nonvolatile memory device using the flip read voltage corresponding to the i-th flip range Ai (S73), and the ECC decoding is performed based on the corrected read data that are generated based on the flip read data FDi (S74). At S75, a determination may be made whether the ECC decoding results in success. When the ECC decoding results in success (S75: YES), the corrected data or the valid data may be obtained and the ECC decoding is completed. When the ECC decoding results in failure (S75: NO), the index i is checked for whether it indicates the maximum value imax (S76). When the index i is not the maximum value imax (S76: NO), the index i is increased by one (S77) and the processes (S72~S76) are repeated. When the index i is the maximum value imax (S76: YES), the ECC decoding is determined to fail (S78).

As such, the flip range setter 300 in FIG. 1 may set a plurality of flip ranges based on distribution data indicating degeneration degree of retention characteristics of the nonvolatile memory device 30. The flip range setter 300 may determine an order of generating the plurality of corrected data respectively corresponding to the plurality of flip ranges based on the distribution data. The data regenerator 200 may sequentially generate each of a plurality of corrected data respectively corresponding to the plurality of flip ranges. The ECC decoder may sequentially perform the second ECC decoding with respect to each of the plurality of corrected data, until the second ECC decoding with respect to one of the plurality of corrected data results in success.

Figure 16:
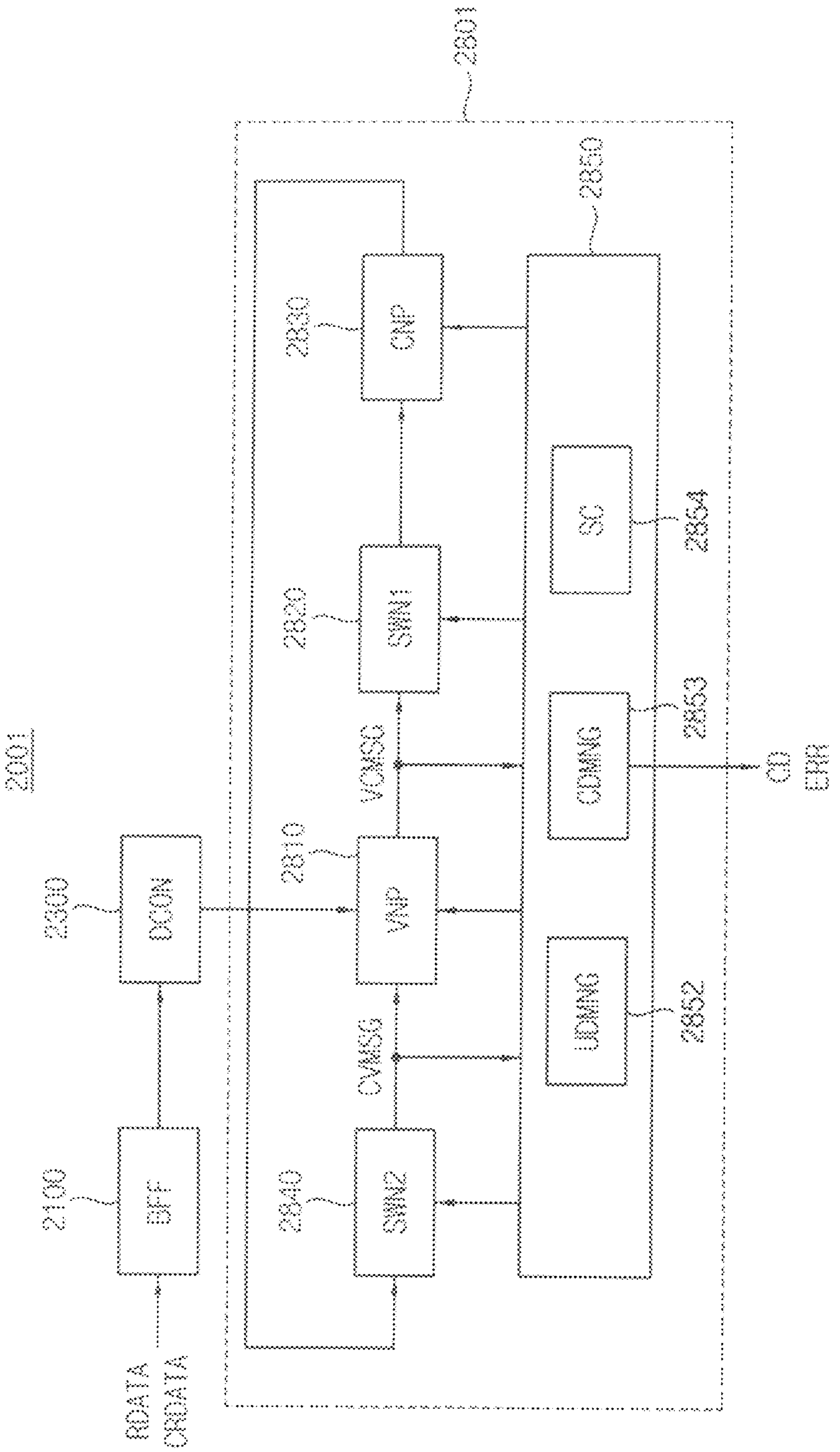
FIG. 16 is a block diagram illustrating an example embodiment of an ECC decoder included in a memory controller according to example embodiments.

FIG. 16 is a block diagram illustrating an example embodiment of an ECC decoder included in a memory controller according to example embodiments.

Referring to FIG. 16, an ECC decoder 2001 may include a buffer 2100 (BFF), a data converter 2300 (DCON) and a decoding circuit 2801.

The buffer 2100 may store normal read data RDATA read from the nonvolatile memory device 30 in FIG. 1 and corrected read data CRDATA generated by the data regenerator 200 in FIG. 1. The normal read data RDATA and the corrected read data CRDATA may include hard-decision data and the soft-decision data.

When a hard-decision is conducted, the buffer 2100 receives the hard-decision data that are read using a hard-decision read voltage from the nonvolatile memory device 30 and stores the received data. The stored data may be provided to the data converter 2300 for the decoding operation. When a soft-decision is conducted, the buffer 2100 receives the soft-decision data that are read using soft-decision read voltages from the nonvolatile memory device 30 in addition to the hard-decision data and stores the received data. The soft-decision read voltages are voltages that are proximate to the hard-decision read voltage but have a voltage level different than the voltage level of the hard-decision read voltage. The hard-decision data and the soft-decision data stored in the buffer 2100 may be provided to the data converter 2300 for the decoding operation. The hard-decision data and the soft-decision data will be further described with reference to FIG. 17 and FIG. 19.

The data converter 2300 may be configured to map the LLR (log likelihood ratio) values to the provided data. In some example embodiments, the data converter 2300 may include a hard-decision LLR register (not shown) storing LLR values to be mapped during a hard-decision and a soft-decision LLR register (not shown) storing LLR values to be mapped during the soft-decision.

During the hard-decision, the data converter 2300 receives the hard-decision data from the buffer 2100. The data converter 2300 maps the hard-decision data with corresponding LLR values according to each bit value of the hard-decision data. During the soft-decision, the data converter 2300 receives the hard-decision data and the soft-decision data from the buffer 2100. The data converter 2300 maps the hard-decision data with corresponding LLR values according to each bit value of the soft-decision data. During the hard-decision or the soft-decision, a result of the mapping carried out by the data converter 2300 is output to the decoding circuit 2800 as LLR data.

The decoding circuit 2801 performs, for example, LDPC (low density parity check) decoding on the received LLR data. During the hard-decision and the soft-decision, respective LLR data may be LDPC-decoded using the same method and device. The decoding circuit 2801 updates check nodes and variable nodes according to a parity check matrix (PCM) during the LDPC decoding. The decoding circuit 2801 performs provisional decoding according to a result of the update (e.g., posteriori probability) and computes the provisionally decoded data and the parity check matrix to determine whether decoding is correctly performed according to a result of the computation.

For example, if the result of computation with the parity check matrix is a zero matrix, the decoding is determined to be correctly performed. If the result is not a zero matrix, the decoding is determined to not be correctly performed. If the decoding is correctly performed, the decoding circuit 2801 outputs the decoded data as decoded data CD. If the decoding is not correctly performed (e.g., all errors of the read data are not corrected), the decoding circuit 2801 re-updates the check nodes and the variable nodes.

The above update and provisional decoding of check nodes and variable nodes are iteratively performed. The update and provisional decoding of check nodes and variable nodes may constitute a single decoding loop, that is, a decoding iteration.

When the hard-decision is conducted in the decoding circuit 2801 and parity check based on the hard-decision is failed, the decoding circuit 2801 transmits a fail message ERR.

The decoding circuit 2801 may include a variable node processor 2810 (VNP), a first switch network 2820 (SWN1), a check node processor 2830 (CNP), a second switch network 2840 (SWN2), and a controller 2850. The controller 2850 may include an update manager 2852 (UDMNG), a corrected data manager 2853 (CDMNG) and a syndrome checker 2854 (SC).

During the LDPC decoding, a nonzero element in the parity check matrix indicates that a corresponding variable node and a corresponding check node are connected to each other. The decoding is performed through data transmitted according to the connection of the variable node and the check node.

The variable node processor 2810 stores the provided LLR data from the data converter 2300 and provides the stored LLR data, as a variable node message VCMSG, to the check node processor 2830 through the first switch network 2820.

The check node processor 2830 compares values of variable nodes with respect to each check node with reference to the provided variable node message VCMSG to provide a check node message CVMSG. The check node message CVMSG is provided to the variable node processor 2810 through the second switch network 2840.

The variable node processor 2810 updates values of the variable and check nodes with reference to the received check node message CVMSG. The variable node processor 2810 performs decoding according to the updated values of the variable and check nodes. A result of the decoding is provided to the corrected data manager 2853 as decoding data.

The corrected data manager 2853 stores the result of the decoding performed in the variable node processor 2810 and outputs the corrected data CD or a read error message ERR to an external device depending on whether decoding of the syndrome checker 2854 is successfully performed.

The syndrome checker 2854 determines whether the decoding is successfully performed, according to the decoding data stored in the corrected data manager 2853. For example, the syndrome checker 2854 multiplies the decoding data by a transpose matrix of the parity check matrix and determines whether the decoding is successfully performed (or whether all errors are corrected) depending on whether a result of the multiplication is a zero matrix. The syndrome checker 2854 provides a result of the determination to the corrected data manager 2853.

Figure 17:
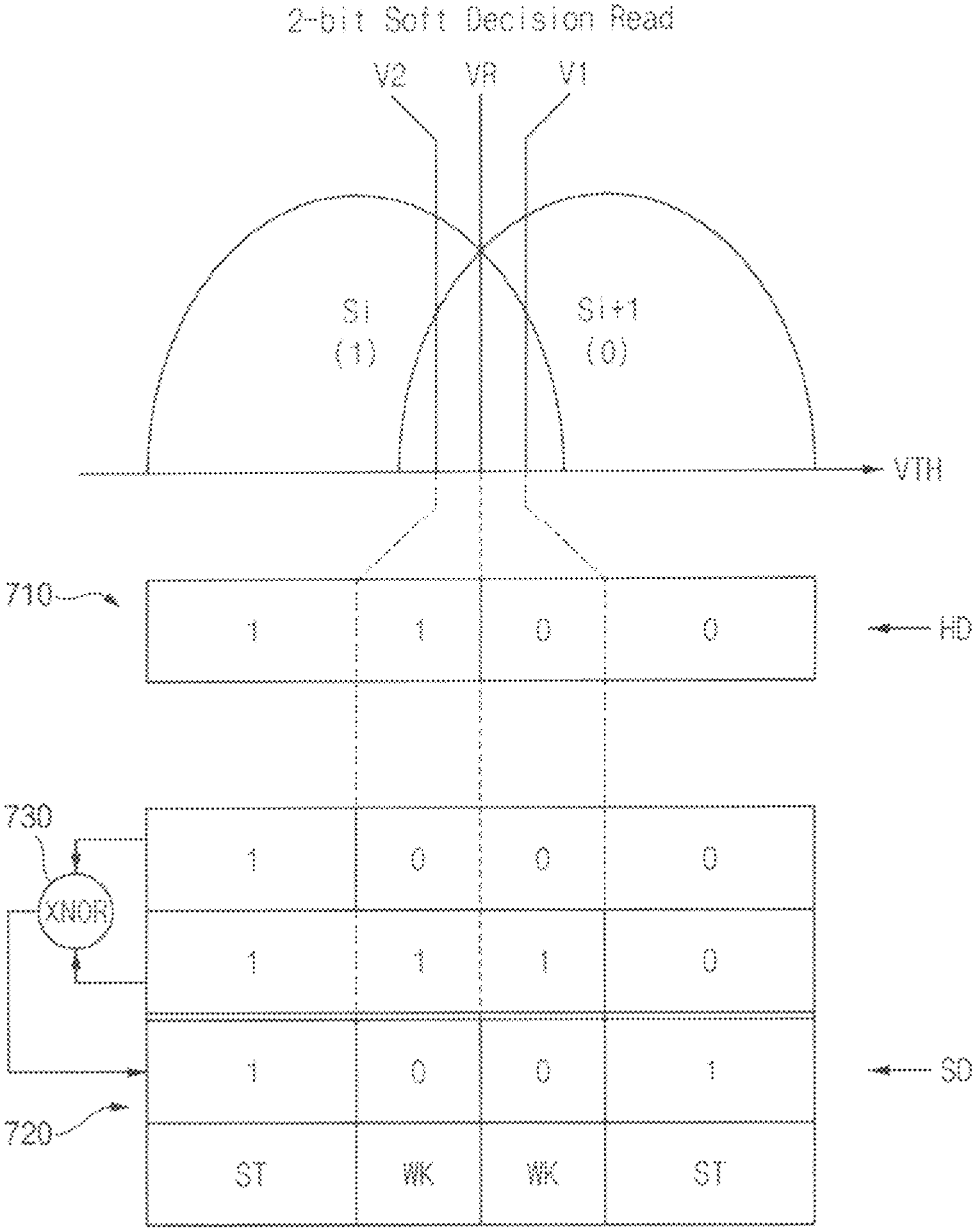
FIG. 17 is a diagram illustrating an example of a 2-bit soft-decision read operation of a nonvolatile memory device included in a memory system according to example embodiments.

FIG. 17 is a diagram illustrating an example of a 2-bit soft-decision read operation of a nonvolatile memory device included in a memory system according to example embodiments.

Referring to FIG. 17, the threshold voltages VTH of the memory cells may be changed due to various factors and thus the two adjacent states Si and Si+1 or the two adjacent threshold voltage distributions Si and Si+1 may be superimposed. The change of the threshold voltages VTH may be caused by interference between the memory cells, program disturbance, read disturbance, charge leakage, etc.

As illustrated in FIG. 17, the nonvolatile memory device may perform a 2-bit soft-decision read operation. The 2-bit soft-decision read operation may include three read operations using three voltages VR, V1 and V2 having regular intervals. For example, the three voltages VR, V1 and V2 may include a hard-decision read voltage VR having a desired and/or alternatively predetermined reference level for distinguishing between a first state Si corresponding to data '1' and a second state Si+1 corresponding to data '0', a first soft-decision read voltage V1 higher than the hard-decision read voltage VR, and a second soft-decision read voltage V2 lower than the hard-decision read voltage VR.

In some example embodiments, hard-decision data 710 read by using the hard-decision read voltage VR may be hard-decision data 710 (HD) read by a hard-decision read operation. The 2-bit soft-decision read operation may use the hard-decision data 710 read by the hard-decision read operation without applying the hard-decision read voltage VR again. The 2-bit soft-decision read operation may generate soft-decision data 720 (SD) having reliability information for the hard-decision data 710 by performing a desired and/or alternatively predetermined logical operation (e.g., an XNOR operation 730) (or encoding) on data read by using the first soft-decision read voltage V1 and data read by using the second soft-decision read voltage V2. Each bit of the soft-decision data 720 may represent a degree of reliability of a corresponding bit of the hard-decision data 710. For example, a bit of the soft-decision data 720 having a value of '1' may represent that a corresponding bit of the hard-decision data 710 has strong (ST) reliability. A bit of the soft-decision data 720 having a value of '0' may represent that a corresponding bit of the hard-decision data 710 has weak (WK) reliability.

FIG. 18 is a diagram illustrating an example of a log likelihood ratio (LLR) corresponding to the 2-bit soft-decision read operation of FIG. 17.

Referring to FIG. 18, the first bit of the read data RDATA may correspond to the hard-decision data and the second bit of the read data RDATA may correspond to the soft-decision data. The hard-decision data may be the read bit and the soft-decision data may indicate the reliability. As described with reference to FIG. 17, a bit of the soft-decision data having a value of '1' may represent that a corresponding bit of the hard-decision data has strong (ST) reliability. A bit of the soft-decision data having a value of '0' may represent that a corresponding bit of the hard-decision data has weak (WK) reliability.

The LLR generator LGEN included in the data converter 2300 may generate a plurality of LLRs corresponding to the read data RDATA based on the read bits and the corresponding reliability.

For example, the LLR may be defined as Expression 2. The definition of the LLR is not limited to Expression 2 and the LLR may be defined by a different methodology.

$$LLR(Y) = C * \log\{P(Y \mid X = 1)/P(Y \mid X = 0)\} \quad \text{Expression 2}$$

In Expression 2, Y indicates a read bit that is read from a memory cell, X indicates a write bit that has been programmed or written in the memory cell, and C indicates a normalization constant. As a result, the positive value of the LLR may represent that the read bit may be 1 with a higher probability than 0. In contrast, the negative value of the LLR may represent that the read bit may be 0 with a higher probability than 1.

FIG. 18 illustrates an example of mapping between the read data RDATA and the LLR. In FIG. 18, L indicates a positive value which may be set to a proper value according to a decoding scheme. The LLR of +4 L indicates the bit value of 1 with ST reliability, the LLR of +2 L indicates the bit value of 1 with WK reliability, LLR of −4 L indicates the bit value of 0 with ST reliability, and the LLR of −2 L indicates the bit value of 0 with WK reliability. The mapping of FIG. 18 is just an example, and example embodiments are not limited thereto.

Figure 19:
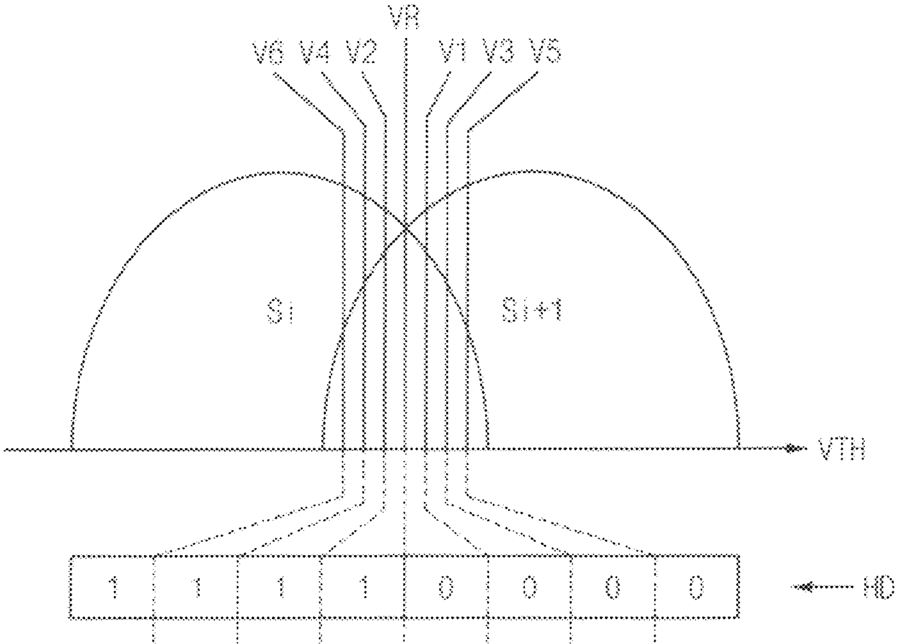
FIG. 19 is a diagram illustrating an example of a 3-bit soft-decision read operation of a nonvolatile memory device included in a memory system according to example embodiments.

FIG. 19 is a diagram illustrating an example of a 3-bit soft-decision read operation of a nonvolatile memory device included in a memory system according to example embodiments. Hereinafter, the descriptions repeated with FIG. 17 and FIG. 18 are omitted.

As illustrated in FIG. 19, the nonvolatile memory device may perform a 3-bit soft-decision read operation when the soft-decision data is 3-bit soft-decision data. The 3-bit soft-decision read operation may include five read operations using seven voltages VR, V1, V2, V3, V4, V5 and V6 having regular intervals. The data read by using the hard-decision read voltage VR may be the hard-decision data HD read by the hard-decision read operation. The data read by using the soft-decision read voltages V1-V6 may be used to obtain the soft-decision data SD. The soft-decision data SD may include a higher bit SDH read by using the soft-decision read voltages V3 and V4 and a lower bit SDL read by using the soft-decision read voltages V1, V2, V5 and V6. The higher bits SDH and the lower bits SDL of the soft-decision data SD may be obtained by performing desired and/or alternatively predetermined logical operations (e.g., XNOR operations or encoding) on data read by using the soft-decision read voltages V1~V6. Each bit pair of the soft-decision data SD having two bits SDH and SDL may represent a degree of reliability of a corresponding bit of the hard-decision data HD. For example, each soft-decision bit pair having a value of '11' may represent that a corresponding bit of the hard-decision data has very strong (VST) reliability, each soft-decision bit pair having a value of '10' may represent that a corresponding bit of the hard-decision data has strong (ST) reliability, each soft-decision bit pair having a value of '00' may represent that a corresponding bit of the hard-decision data has weak (WK) reliability, and each soft-decision bit pair having a value of '01' may represent that a corresponding bit of the hard-decision data has very weak (VWK) reliability.

FIG. 20 is a diagram illustrating an example of a log likelihood ratio (LLR) corresponding to the 3-bit soft-decision read operation of FIG. 19.

Referring to FIG. 20, the first bit of the read data RDATA may correspond to the hard-decision data and the second and third bits of the read data RDATA may correspond to the soft-decision data. The hard-decision data may be the read bit and the soft-decision data may indicate the reliability of the hard-decision data. As described with reference to FIG. 19, the soft-decision data having a value of '11' may represent that a corresponding bit of the hard-decision data has very strong (VST) reliability, the soft-decision data having a value of '10' may represent that a corresponding bit of the hard-decision data has strong (ST) reliability, the soft-decision data having a value of '00' may represent that a corresponding bit of the hard-decision data has weak (WK) reliability. The soft-decision data having a value of '01' may represent that a corresponding bit of the hard-decision data has very weak (VWK) reliability.

FIG. 20 illustrates an example of mapping between the read data RDATA (middle row) and the LLR (bottom row). In FIG. 20, L indicates a positive value which may be set to a proper value according to a decoding scheme. The LLR of +7 L indicates the bit value of 1 with VST reliability, the LLR of +5 L indicates the bit value of 1 with ST reliability, the LLR of +3 L indicates the bit value of 1 with WK reliability, the LLR of +L indicates the bit value of 1 with VWK reliability, the LLR of −7 L indicates the bit value of 0 with VST reliability, the LLR of −5 L indicates the bit value of 0 with ST reliability, the LLR of −3 L indicates the bit value of 0 with WK reliability, and the LLR of −L indicates the bit value of 0 with VWK reliability.

Figure 21:
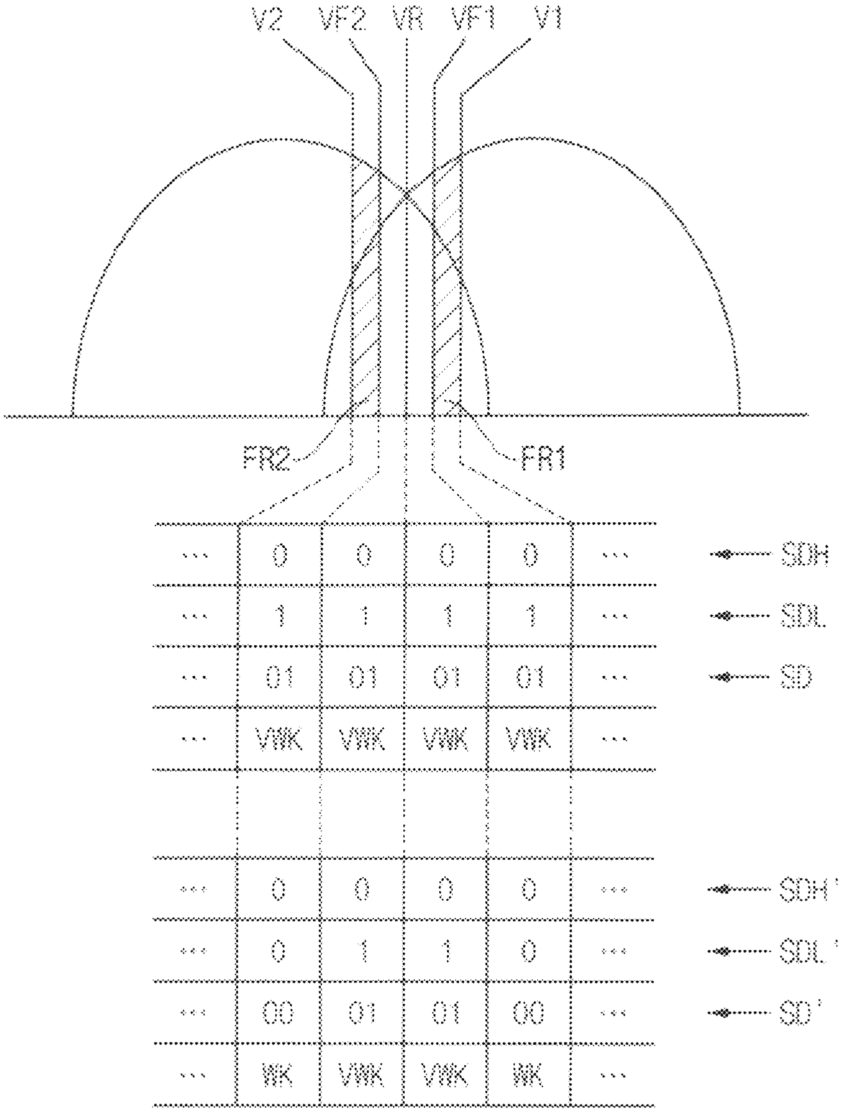
FIG. 21 is a diagram illustrating an example embodiment of generating corrected read data in a method of ECC decoding according to example embodiments.

FIG. 21 is a diagram illustrating an example embodiment of generating corrected read data in a method of ECC decoding according to example embodiments.

FIG. 21 illustrates a method of generating the corrected read data in case of the 3-bit soft-decision read operation as described with reference to FIG. 19. As described above, the normal read data may include, in addition to the hard-decision data, the soft-decision data that are read based on the soft-decision read voltages. In this case, the corrected soft-decision data may be generated based on the flip read data by inverting the error candidate bits included in the flip range. For convenience of illustration and description, FIG.

21 illustrates a portion of voltages and a portion of data bits that are required to describe example embodiments. The soft-decision data SD may include the higher bit SDH and the lower bit SDL. The corrected soft-decision data SD' including the higher bit SDH' and the lower bit SDL' may be generated according to example embodiments.

Referring to FIG. 1 and FIG. 21, when the ECC decoding with respect to the soft-decision data SD results in failure, the memory controller 20 may read the flip read data from the nonvolatile memory device 30 based on a first flip read voltage VF1 and a second flip read voltage VF2. The soft-decision read voltages may include a first soft-decision read voltage V1 higher than the hard-decision read voltage VR and a second soft-decision read voltage V2 lower than the hard-decision read voltage VR. The first flip read voltage VF1 is between the hard-decision read voltage VR and the first soft-decision read voltage V1. The second flip read voltage VF2 is between the hard-decision read voltage VR and the second soft-decision read voltage V2.

The data regenerator 200 may perform a bitwise logic operation on the soft-decision data SD and the flip read data. The data regenerator 200 may invert the error candidate bits to generate the corrected soft-decision data SD'. Here, the error candidate bits may be included in a first flip range FR1 between the first soft-decision read voltage V1 and the first flip read voltage VF1 and a second flip range FR2 between the second soft-decision read voltage V2 and the second flip read voltage VF2.

As illustrated in FIG. 21, the higher bits SDH' of the corrected soft-decision data SD' may be equal to the higher bits SDH of the soft-decision data SD. The lower bits SDL' of the corrected soft-decision data SD' may be generated by inverting the error candidate bits included in the first flip range FR1 and the second flip range FR2 among the lower bits SDL of the soft-decision data SD.

In some example embodiments, the data regenerator 200 may generate the lower bits SDL' of the corrected soft-decision data SD' based on a bitwise logic operation in Expression 3.

$$SDL'[i] = (SDH[i] \text{ AND } SDL[i] \text{ AND } FD[i]) \; XOR \; (\sim SDH[i] \text{ AND } SDL[i] \text{ AND} \sim FD[i]) \quad \text{Expression 3}$$

In Expression 3, SDL'[i] indicates each lower bit of the corrected soft-decision data, SDH[i] indicates each higher bit of the soft-decision data, FD[i] indicates each bit of the flip read data, "AND" indicates an AND logic operation, "XOR" indicates an exclusive OR logic operation, and "~" indicates an inversion logic operation.

As a result, the threshold voltage range VF2~VF1 corresponding to the lowest reliability (e.g., the very weak (VWK) reliability) of the corrected soft-decision data SD' may be narrower than the threshold voltage range V2~V1 corresponding to the lowest reliability of the soft-decision data SD.

As described above, the flip range setter 300 may set the flip range FR1 and FR2 based on the distribution data indicating degeneration degree of retention characteristics of the nonvolatile memory device. In other words, the flip range setter 300 may determine the first flip read voltage VF1 corresponding to the first flip range FR1 and the second flip read voltage VF2 corresponding to the second flip range FR2, based on the distribution data. As will be described below with reference to FIG. 24, the distribution data may be cell count information.

Figures 22A, 22B:
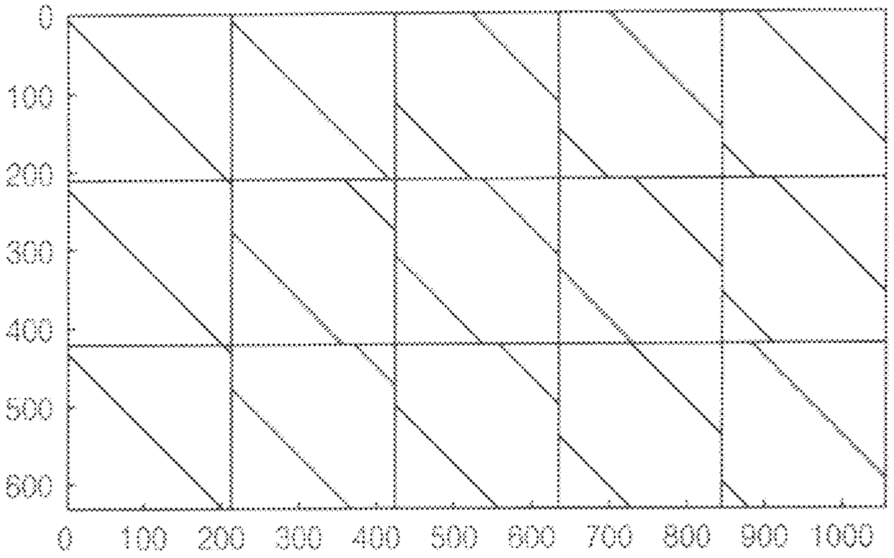
FIG. 22A and FIG. 22B are diagram for describing a quasi-cyclic low density parity check (QC-LDPC) applicable to a method of ECC decoding according to example embodiments.

FIG. 22A and FIG. 22B are diagram for describing a quasi-cyclic low density parity check (QC-LDPC) applicable to a method of ECC decoding according to example embodiments.

An LDPC code having a codeword length of n and an information length of k may be represented by the parity check matrix (PCM) having a size of (n−k)*n. The LDPC code has a higher correction capability as the codeword length is long. For example, the memory controller may use a codeword longer than 1 KB. The size of the parity check matrix of the long codeword is very large and it is difficult to store the parity check matrix with a large size.

To solve such problems, the parity check matrix may be divided into a plurality of sub blocks and the parity check matrix may be defined by information of each sub matrix, for example, a position of each sub matrix, a shape of each sub matrix, etc. The LDPC code defined as such may be referred to as a quasi-cyclic LDPC (QC-LDPC) code. For example, if the codeword length is 1055 bits and the information length is 422 (=1055-633), and if the size of the sub matrix is 211, the five sub matrices may be arranged in each row (1055/211=5) and the three sub matrices may be arranged in each column (633/211=3) as illustrated in FIG. 22A. Each sub matrix may be obtained by a circular shifting of an identity matrix. The parity check matrix may be simplified to a 3*5 matrix as illustrated in FIG. 31B using shifter numbers of the sub matrices. In other words, the parity check matrix may be represented simply in comparison with the representation of a 633*1055 matrix. The QC-LDPC code may be efficiently applied to various systems.

Figure 23:
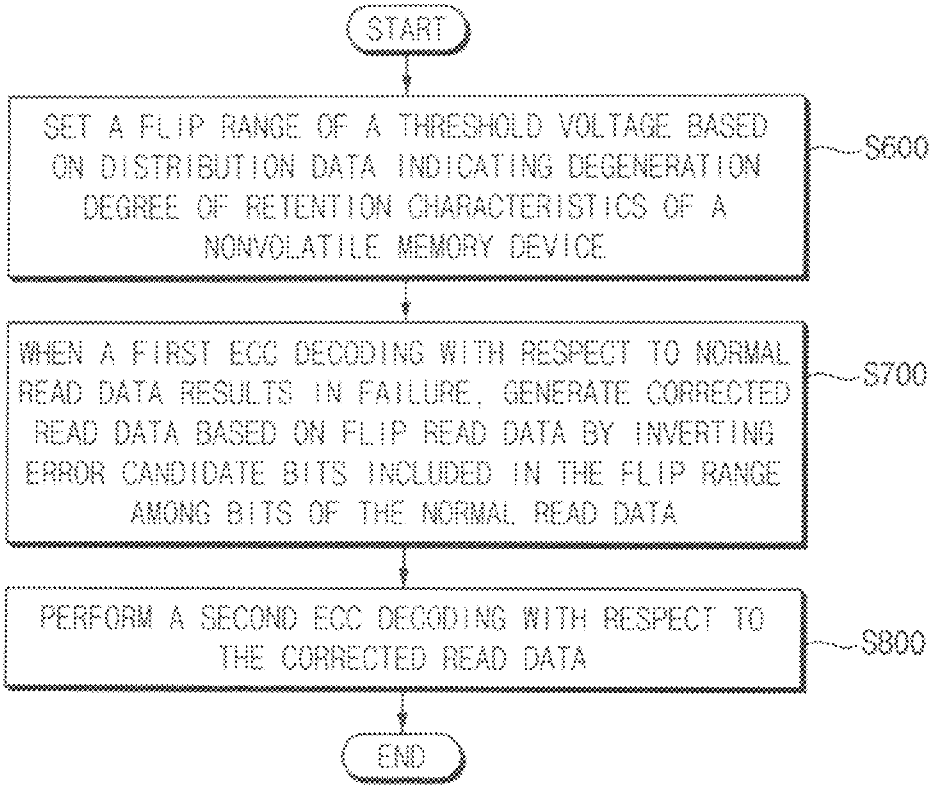
FIG. 23 is a flowchart illustrating a method of ECC decoding according to example embodiments.

FIG. 23 is a flowchart illustrating a method of ECC decoding according to example embodiments.

Referring to FIG. 1 and FIG. 23, the flip range setter 300 may set a flip range of a threshold voltage based on distribution data indicating degeneration degree of retention characteristics of a nonvolatile memory device (S600).

As described above, when a first ECC decoding with respect to normal read data results in failure, the data regenerator 200 may generate corrected read data based on flip read data by inverting error candidate bits included in the flip range among bits of the normal read data (S700). The ECC decoder DEC may perform a second ECC decoding with respect to the corrected read data (S800).

The flip range setter 300 may set at least one of a position and a magnitude of the flip range based on the distribution data. Setting of the position of the flip range may include selecting one of the high flip range FRh in FIG. 8 and the low flip range FR1 in FIG. 9. Setting the magnitude of the flip range may include determining the above-described flip read voltage.

In addition, as described with reference to FIG. 13, FIG. 14 and FIG. 15, the flip range setter 300 may set the plurality of flip ranges based on distribution data indicating degeneration degree of retention characteristics of the nonvolatile memory device 30. The data regenerator 200 may sequentially generate each of a plurality of corrected data respectively corresponding to the plurality of flip ranges, and the ECC decoder DEC may sequentially perform the second ECC decoding with respect to each of the plurality of corrected data, until the second ECC decoding with respect to one of the plurality of corrected data results in success. The flip range setter 300 may determine an order of generating the plurality of corrected data respectively corresponding to the plurality of flip ranges, for example, the order of flip ranges FR1-FR6 in FIG. 14, based on the distribution data.

Figure 24:
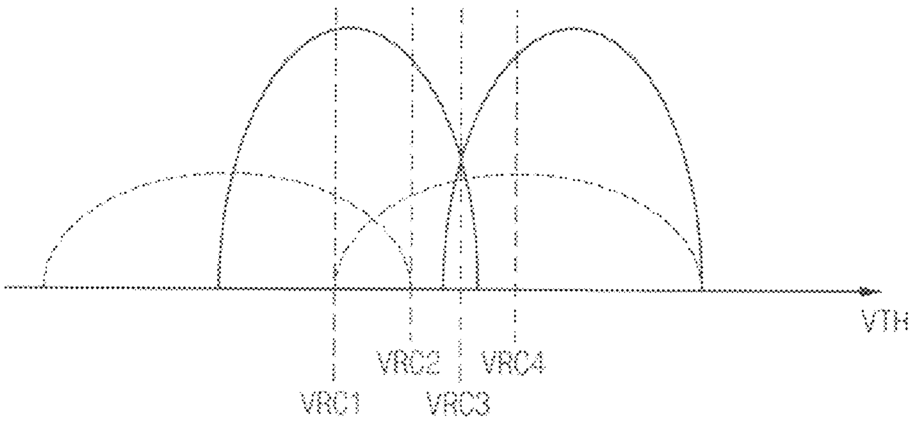
FIG. 24 is a diagram illustrating an example of distribution data for setting a flip range in a method of ECC decoding according to example embodiments.

FIG. 24 is a diagram illustrating an example of distribution data for setting a flip range in a method of ECC decoding according to example embodiments.

FIG. 24 illustrates two adjacent states. The solid lines indicate a case corresponding to the relatively lower degeneration degree of the retention characteristics of the nonvolatile memory device and the dotted lines indicate a case corresponding to the relatively higher degeneration degree of the retention characteristics of the nonvolatile memory device. As the degeneration decree increases, the threshold voltage distribution may be broadened and the threshold voltages may be decreased.

For example, read operations may be performed with respect to one wordline based on cell count read voltage VRC1~VRC4 to detect cell counts, where the cell counts corresponds to the numbers of on cells or off cells included in the respective threshold voltage ranges. In general, the memory system stores the cell count information for control of the nonvolatile memory device. The flip range setter 300 may set the proper flip range using the cell count information as the above-described distribution data.

Figure 25:
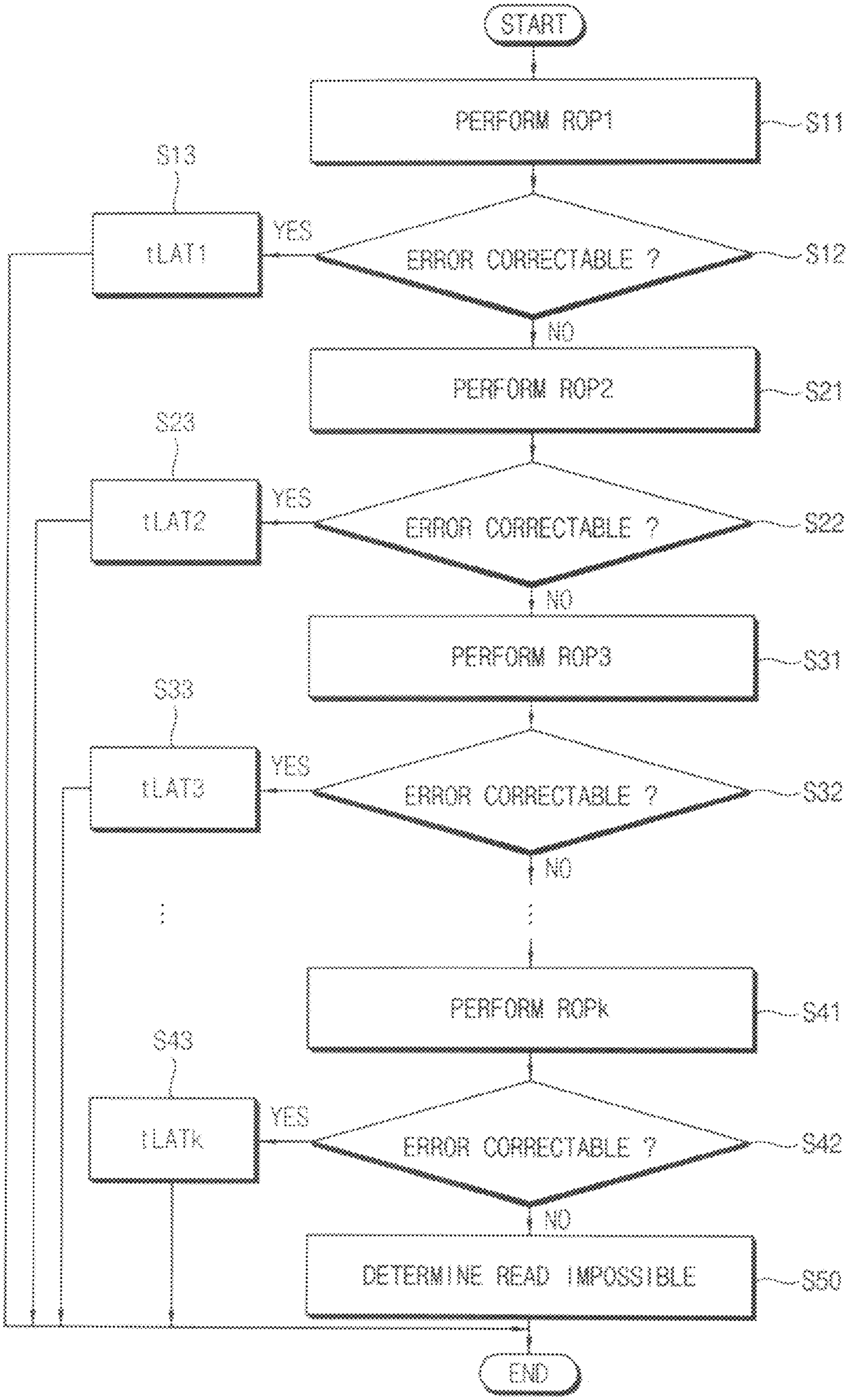
FIG. 25 is a flow chart illustrating a read method based on a read sequence of a nonvolatile memory device according to example embodiments.

FIG. 25 is a flow chart illustrating a read method based on a read sequence of a nonvolatile memory device according to example embodiments.

Referring to FIG. 25, according to the set read sequence RSET, the first read operation ROP1 of the highest priority is performed (S11). Each read operation may include the ECC decoding with respect to the read data. When the error in the read data is correctable by the ECC decoding (S12: YES), the first read time tRD1 of the first read operation ROP1 is determined as the read latency tLAT1 (S13). When the error is correctable, the valid data may be obtained and the read sequence RSEQ is finished.

When the error is not correctable (S12: NO), the second read operation ROP2 of the next priority is performed (S21). When the error in the read data is correctable by the ECC decoding (S22: YES), the sum tRD1+tRD2 of the read times of the first read operation ROP1 and the second read operation ROP2 is determined as the read latency tLAT2 (S23).

When the error is not correctable (S12: NO), the third read operation ROP3 of the next priority is performed (S31). When the error in the read data is correctable by the ECC decoding (S32: YES), the sum tRD1+tRD2+tRD3 of the read times of the first read operation ROP1, the second read operation ROP2 and the third read operation ROP3 is determined as the read latency tLAT3 (S33).

In this way, when the valid data are not obtained through the read operations of the higher priorities, the last read operation ROPk is performed (S41). When the error in the read data is correctable by the ECC decoding (S42: YES), the sum tRD1+tRD2+ . . . +tRDk of the read times of all read operations ROP1~ROPk is determined as the read latency tLATk (S43).

When the valid data are not obtained by the last read operation ROPk, the data reading is determined to be impossible (S50) and the read sequence RSEQ is finished.

If the operational condition or the operational environment is good, the valid data may be obtained by the first read operation ROP1 for most or all cases, and thus the read latency may be minimized by setting the read sequence such that the read operation of the shorter read time may be performed first. If the operational condition becomes worse, however, the valid data cannot be obtained by the first read operation for most or all cases. The later read operations of the next priorities have to be performed and thus the read latency may be increased unnecessarily due to the useless first read operation. The performance of the nonvolatile memory device may be enhanced by setting a plurality of read sequences respectively corresponding to the different operational conditions and adaptively controlling the read sequences.

Figure 26:
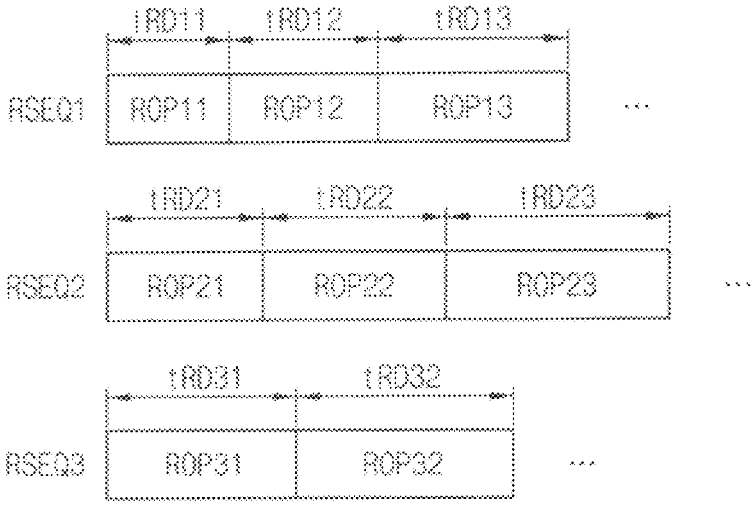
FIG. 26 is a diagram illustrating example embodiments of a read sequence of a nonvolatile memory device according to example embodiments.

FIG. 26 is a diagram illustrating example embodiments of a read sequence of a nonvolatile memory device according to example embodiments.

FIG. 26 illustrates a non-limiting example of three read sequences and two read sequences or four or more read sequences may be set according to example embodiments. As described above, each of the first read sequence RSEQ1, the second read sequence RSEQ2 and the third read sequence RSEQ3 may be set such that the read operation having the shorter read time is performed before the read operation having the longer read time.

The read times of the read operations ROP11, ROP12 and ROP13 in the first read sequence RSEQ1 may satisfy the relation tRD11>tRD12>tRD13, the read times of the read operations ROP21, ROP22 and ROP23 in the second read sequence RSEQ2 may satisfy the relation tRD21<tRD22<tRD23, and the read times of the read operations ROP31 and ROP32 in the third read sequence RSEQ3 may satisfy tRD31<tRD3.

In some example embodiments, the first read sequence RSEQ1 may be set such that the first read operation ROP1 having a first read time tRD11 is performed first in the first read sequence RSEQ1, and the second read sequence RSEQ2 may be set such that the second read operation tRD21 having a second read time tRD21 longer than the first read time tRD11 is performed first in the second read sequence RSEQ2. As the probability of read success by the first read operation ROP11 is increased, the first read sequence RSEQ1 is more proper than the second read sequence RSEQ2. In contrast, as the probability of read success by the first read operation ROP11 is decreased, the second read sequence RSEQ2 is more proper than the first read sequence RSEQ1. In other words, the first read sequence RSEQ1 is preferable to the second read sequence RSEQ2 as the bit error rate (BER) is decreased, and the second read sequence RSEQ2 is preferable to the first read sequence RSEQ1 as the BER is increased.

In further example embodiments, the third read sequence RSEQ3 may be set such that a third read operation ROP31 having a third read time tRD31 longer than the second read time tRD21 is performed first in the third read sequence RSEQ3. As the probability of read success by the second read operation ROP21 is increased, the second read sequence RSEQ2 is more proper than the third read sequence RSEQ3. In contrast, as the probability of read success by the second read operation ROP21 is decreased, the third read sequence RSEQ3 is more proper than the second read sequence RSEQ2. In other words, the second read sequence RSEQ2 is preferable to the third read sequence RSEQ3 as the BER is decreased, and the third read sequence RSEQ3 is preferable to the second read sequence RSEQ2 as the BER is increased.

As such, the first read sequence RSEQ1 may be set for the operational condition of the relatively lower range of the BER, the second read sequence RSEQ2 may be set for the operational condition of the intermediate range of the BER, and the third read sequence RSEQ3 may be set for the operational condition of the relatively higher range of the BER.

Figure 27:
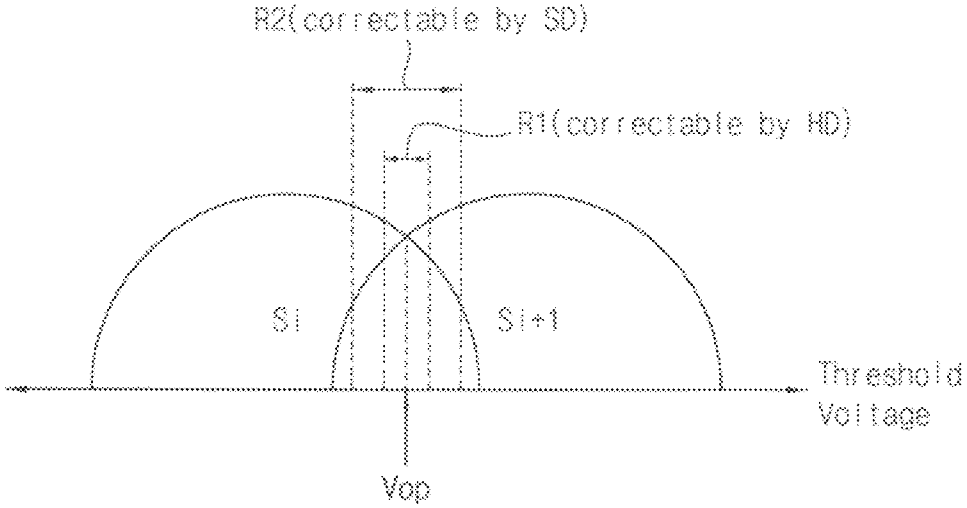
FIG. 27 is a conceptual diagram illustrating a relationship between a predetermined read voltage and an optimal read voltage.

FIG. 27 is a conceptual diagram illustrating a relationship between a predetermined read voltage and an optimal read voltage.

FIG. 27 illustrates threshold voltage distributions of two adjacent states Si and Si+1 in a flash memory device as an example. Hereinafter the example embodiments may be described based on the flash memory device but it can be understood that the inventive concept(s) described herein may be applied to other kinds of the nonvolatile memory devices. For example, the threshold voltage distributions may be replaced with resistance distributions in case of the resistive memory device and the same method of controlling the read sequence may be applied to the resistive memory device by setting a plurality of read sequences for distinguishing the resistance distributions.

An optimal read voltage Vop is a read voltage leading to a minimum number of error bits among data bits that are read out simultaneously. The optimal read voltage Vop corresponds to a valley, that is, a cross point of the threshold voltage distributions of the two states Si and Si+1. When the distributions are shifted and/or broadened according to change of the operational condition, the difference between the predetermined read voltage and the optimal read voltage increases. As the difference is increased, the BER or the probability of the read fail is increased.

When the predetermined voltage is included in a first voltage range R1, the error in the read data may be corrected by the ECC decoding with hard-decision (HD). When the predetermined voltage is included in a second voltage range R2, the error in the read data may be corrected by the ECC decoding with soft-decision (SD).

When the bit errors in the read data are too many and the predetermined read voltage is out of the second range R2, the valid data may not be obtained by the ECC decoding. When the valid data are not obtained through the previous read operations based on the predetermined read voltage, a valley search operation may be performed to determine the optimal read voltage Vop and then a read operation may be performed again based on the optimal read voltage. The valley search operation will be further described with reference to FIG. 33, FIG. 34 and FIG. 35 A valley search operation and read operation based on the optimal read operation may be referred to as a voltage-compensation read operation.

Figure 28:
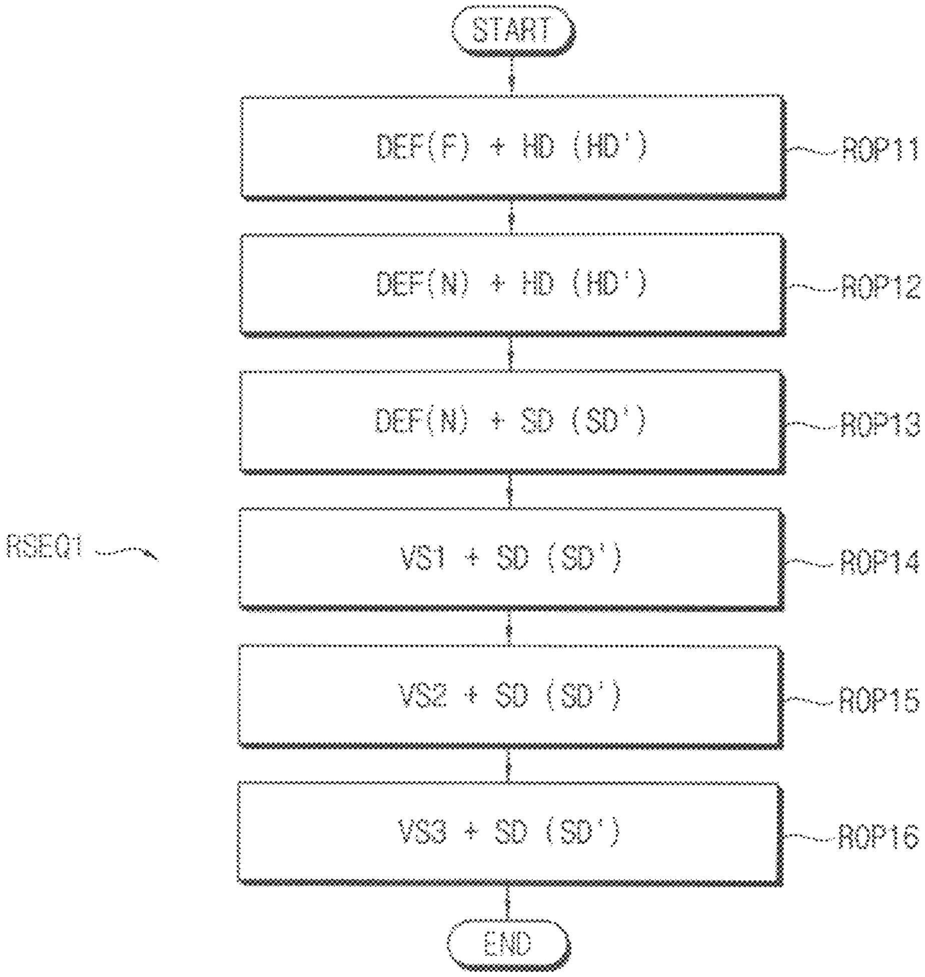
FIG. 28, FIG. 29 and FIG. 30 are diagrams illustrating example embodiments of a read sequence of a nonvolatile memory device according to example embodiments.
Figure 29:
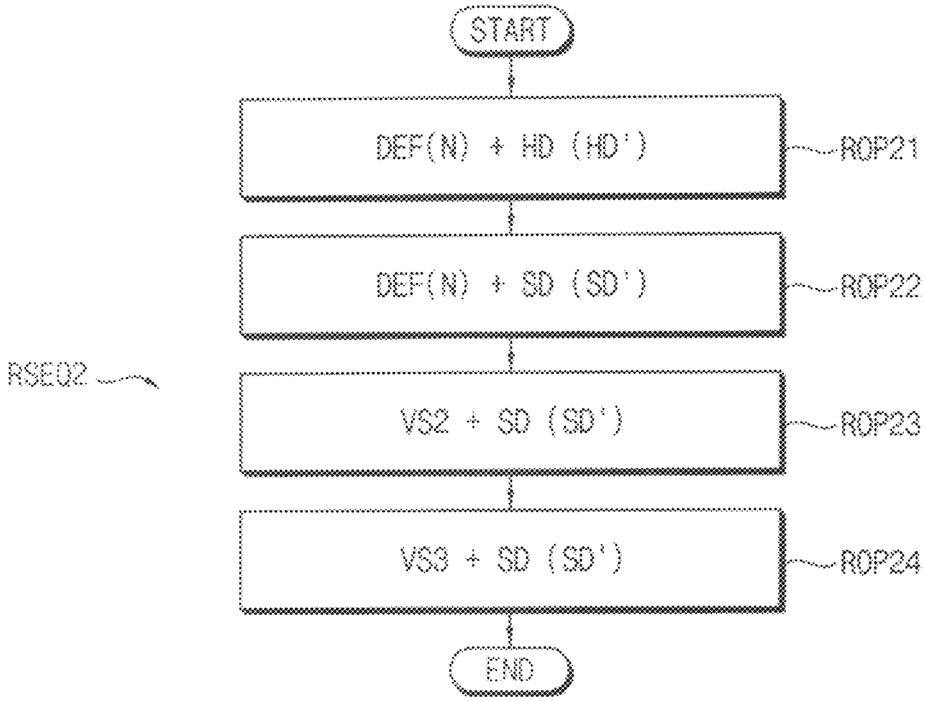
Figure 30:
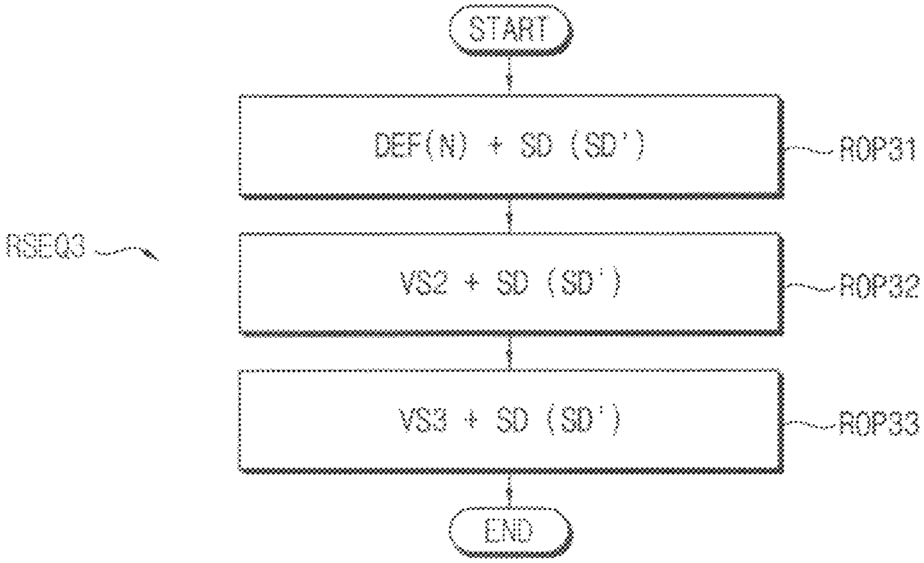

FIG. 28, FIG. 29 and FIG. 30 are diagrams illustrating example embodiments of a read sequence of a nonvolatile memory device according to example embodiments.

Referring to FIG. 28, the first read sequence RSEQ1 may include first through sixth read operations ROP11~ROP16, which are arranged according to respective priorities. The first read operation ROP11, the second read operation ROP12 and the third read operation ROP13 may be based on the predetermined read voltage, and the fourth read operation ROP14, the fifth read operation ROP15 and the sixth read operation ROP16 may be the voltage-compensation read operations.

As described above, the read operation having the shorter read time may be performed before the read operation having the longer read time. In other words, the priory of the read operations may be higher as the read time is shorter. The first read operation ROP11 having the shortest read time, that is, the first read time tRD11, may be performed first. The second read operation ROP12 having the second read time tRD12 longer than the first read time tRD11 is performed after the first read operation ROP11. The sixth read operation ROP16 having the longest read time tRD16 may be performed lastly.

Each of the first read operation ROP11 and the second read operation ROP12 may be a hard-decision (HD) read operation that reads out hard-decision data using the predetermined read voltage and performs the ECC decoding based on the hard-decision data. As will be described with reference to FIG. 31A, FIG. 31B and FIG. 32, the first read operation ROP1I may be a fast read operation DEF(F) based on the predetermined read voltage and the second read operation ROP12 may be a normal read operation DEF(N) based on the predetermined read voltage.

The third read operation ROP13 may be a soft-decision (SD) read operation that reads out the hard-decision data using the predetermined read voltage, provides reliability information of the hard-decision data using a plurality of read voltages around the predetermined read voltage, and performs the ECC decoding based on the hard-decision data and the reliability information.

The fourth read operation ROP14, the fifth read operation ROP15 and the sixth read operation ROP16 may be the voltage-compensation read operations including the valley search operations VS1, VS2 and VS3 and the read operations based on the detected optimal read voltages, respectively. The valley search operations VS1, VS2 and VS3 may be implemented variously to have different search times and different accuracies.

Referring to FIG. 29, the second read sequence RSEQ2 may include first through fourth read operations ROP21~ROP24, which are arranged according to respective priorities. The first read operation ROP21 and the second read operation ROP22 may be based on the predetermined read voltage, and the third read operation ROP23 and the fourth read operation ROP24 may be the voltage-compensation read operations.

As described above, the read operation having the shorter read time may be performed before the read operation having the longer read time. The first read operation ROP21 having the shortest read time, that is, the first read time tRD21, may be performed first. The second read operation ROP22 having the second read time tRD22 longer than the first read time tRD21 is performed after the first read operation ROP21. The fourth read operation ROP24 having the longest read time tRD24 may be performed lastly. The notations DEF(N), HD, SD, VS2 and VS3 are the same as described with reference to FIG. 28.

Referring to FIG. 30, the third read sequence RSEQ3 may include a first read operation ROP31, a second read operation ROP32 and a third read operation ROP33, which are arranged according to respective priorities. The first read operation ROP31 may be based on the predetermined read voltage, and the second read operation ROP32 and the third read operation ROP33 may be the voltage-compensation read operations.

In the conventional schemes, when the ECC decoding based on the hard-decision data HD or the soft-decision data SD results in failure, the next read operation according to the read sequence is performed. According to example embodiments, the ECC decoding based on the corrected hard-decision data HD' or the corrected soft-decision data SD' may be further performed before performing the next read operation, thereby enhancing the probability of success of the ECC decoding and enhancing the error correction capability.

Figure 31A:
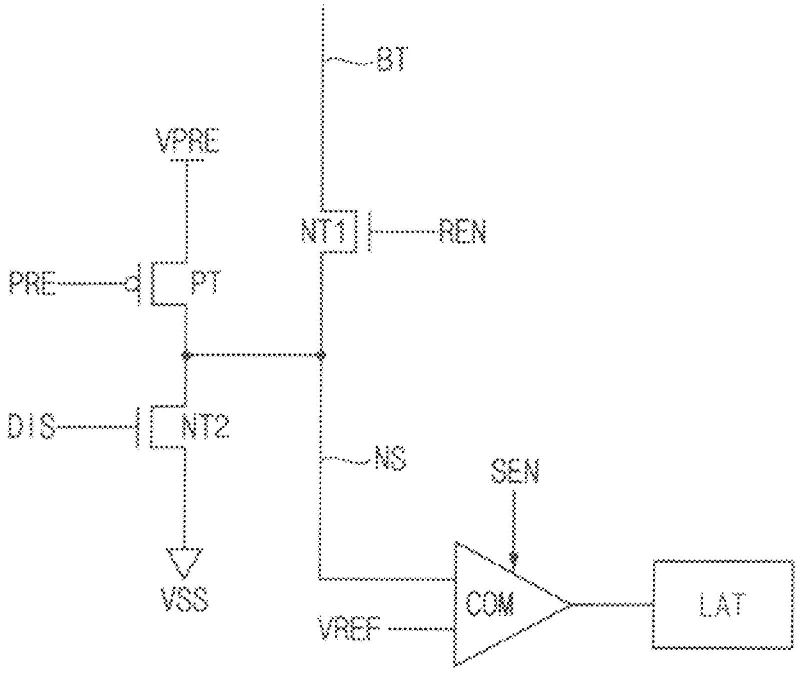
FIG. 31A, FIG. 31B and FIG. 32 are diagrams illustrating an example embodiment of determining read conditions in a method of operating a nonvolatile memory device according to example embodiments.
Figure 31B:
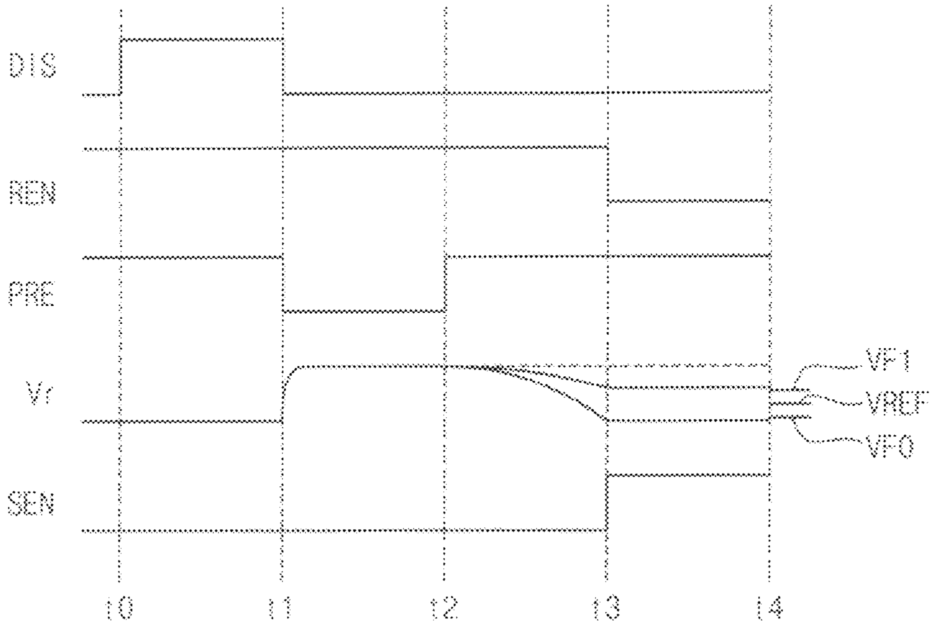
Figure 32:
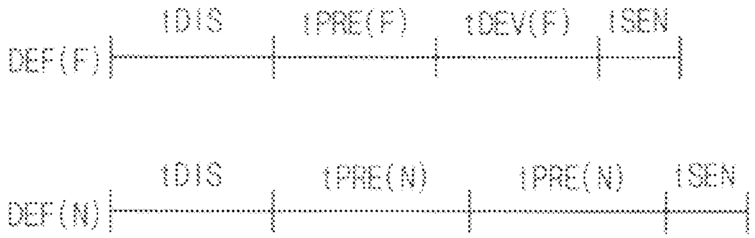

FIG. 31A, FIG. 31B and FIG. 32 are diagrams illustrating an example embodiment of determining read conditions in a method of operating a nonvolatile memory device according to example embodiments.

FIG. 31A illustrates a conceptual configuration of a page buffer and the configuration of the page buffer may be implemented variously. Referring to FIG. 31A, the page buffer may include an enable transistor NT1, a discharge transistor NT2, a precharge transistor PT, a comparator COM and a latch circuit LAT. The enable transistor NT1 may electrically connect a bitline BT and a sensing node NS in response to a read enable signal REN. The discharge transistor NT2 may electrically connect the sensing node NS and a ground voltage VSS in response to a discharge signal DIS. The precharge transistor PT may electrically connect the sensing node NS and a precharge voltage VPRE in response to a precharge signal PRE. The comparator COM may compare a voltage (Vr in FIG. 31B) at the sensing node NS and a reference voltage VREF in response to a sensing enable signal SEN to output a signal indicating the comparison result. The latch circuit LAT may latch the signal output from the comparator COM.

Referring to FIG. 31A and FIG. 32B, when the discharge signal DIS is activated to logic high level during discharge period t0~t1, the bitline voltage Vr is initialized to a ground voltage. When the precharge signal PRE is activated to logic low level during precharge period t1~t2, the bitline voltage Vr is charged with the precharge voltage. When the precharge signal PRE is deactivated to logic high level during develop period t2~t3, the precharge voltage is blocked and the bitline voltage Vr decreases, where the bitline is connected to the ground voltage through the resistive element of the selected memory cell. The voltage VF1 of the bitline coupled to the off-cell of the relatively higher resistance decreases slowly and the voltage VF0 of the bitline coupled to the on-cell of the relatively lower resistance decreases rapidly.

When the sense enable signal SEN is activated to logic high level during sense period t3~t4, the bitline voltage VF1 or VF0 is compared with the read voltage VRD and the data bit stored in the selected memory cell may be read out.

FIG. 32 illustrates examples of the fast read operation DEF(F) and the normal read operation DEF(N) which are mentioned in FIG. 28. The data read time may include a discharge time tDIS, a precharge time tPRE, a develop time tDEV and a latching or sensing time tSEN. Even though not illustrated in FIG. 32, the data read time associated with the read latency may further include delay times such as times for signal transfers between the memory controller and the memory device, address decoding, ECC decoding, etc. The accuracy or reliability of the read data may be enhanced as the precharge time tPRE or the develop time tDEV is increased.

Figure 33:
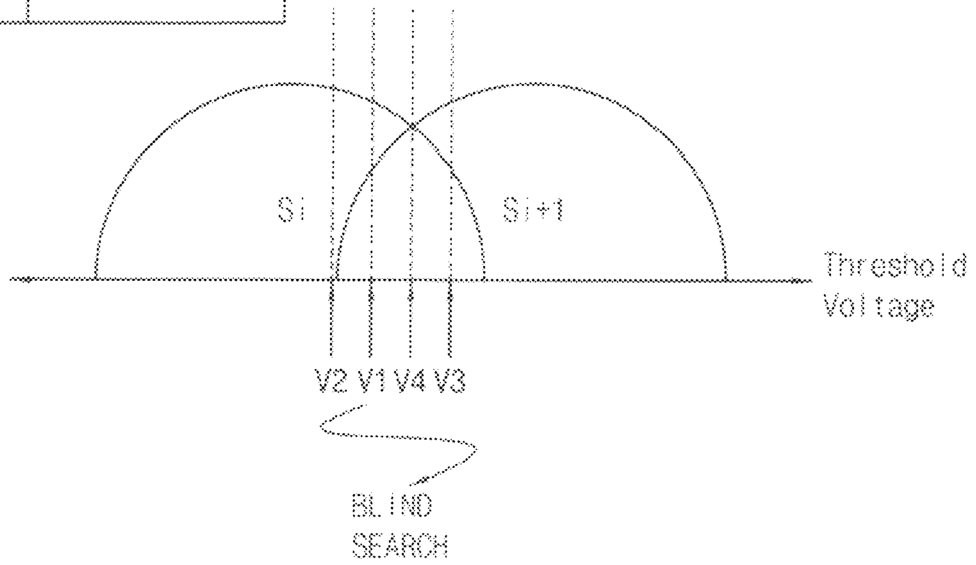
FIG. 33, FIG. 34 and FIG. 35 are diagrams illustrating valley search methods according to example embodiments.
Figure 34:
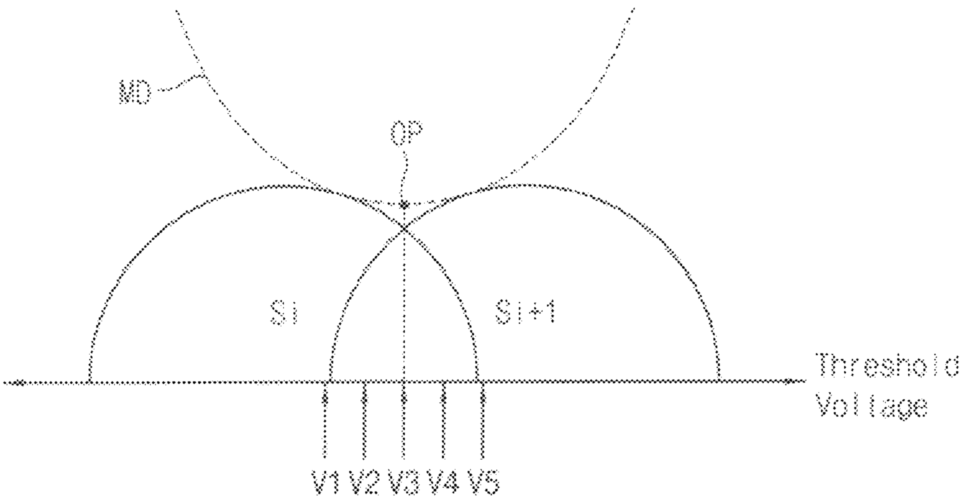
Figure 35:
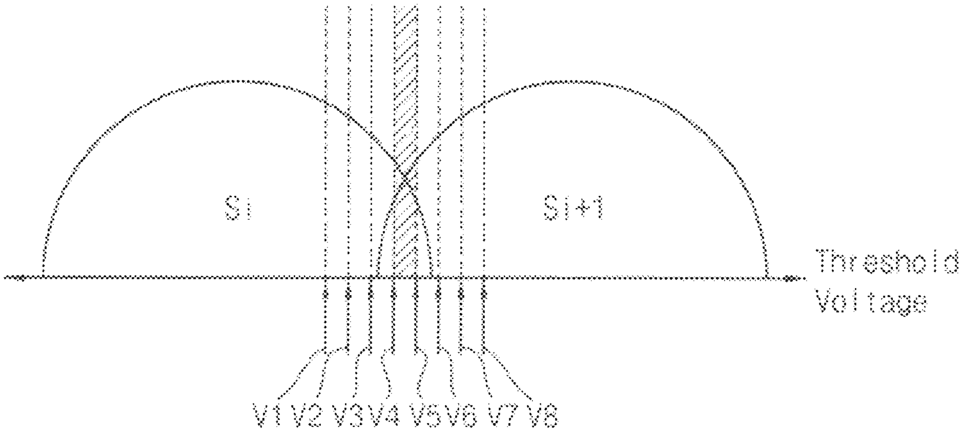

FIG. 33, FIG. 34 and FIG. 35 are diagrams illustrating valley search methods according to example embodiments. The valley search methods in FIG. 33, FIG. 34 and FIG. 35 are non-limiting examples and the valley search method may be implemented variously.

Referring to FIG. 33, an offset table may be provided by analyzing the shift trends of the memory cells through the various test processes. The valley search method may be performed by referring to the offset table and testing the read voltages V1~V4 having higher probability of valley with a blind searching scheme.

Referring to FIG. 34, the valley search method may be performed by scanning the distributions around the valley using the read voltages V1~V5 and modeling the second-order curve MD. The voltage corresponding to the vertex of the modeled curve MD may be determined as the optimal read voltage.

Referring to FIG. 35, the valley search method may be performed by searching the valley point using the read voltages V1~V8 of relatively narrow intervals. The voltage corresponding to a minimum cell number may be determined as the optimal voltage.

The valley search method of FIG. 33 requires the shortest search time but has the lowest accuracy. In contrast, the valley search method of FIG. 35 requires the longest search time but has the highest accuracy. As such, the optimal read voltage may be determined using the various valley search methods or operations having different searching times and accuracies.

Figure 36:
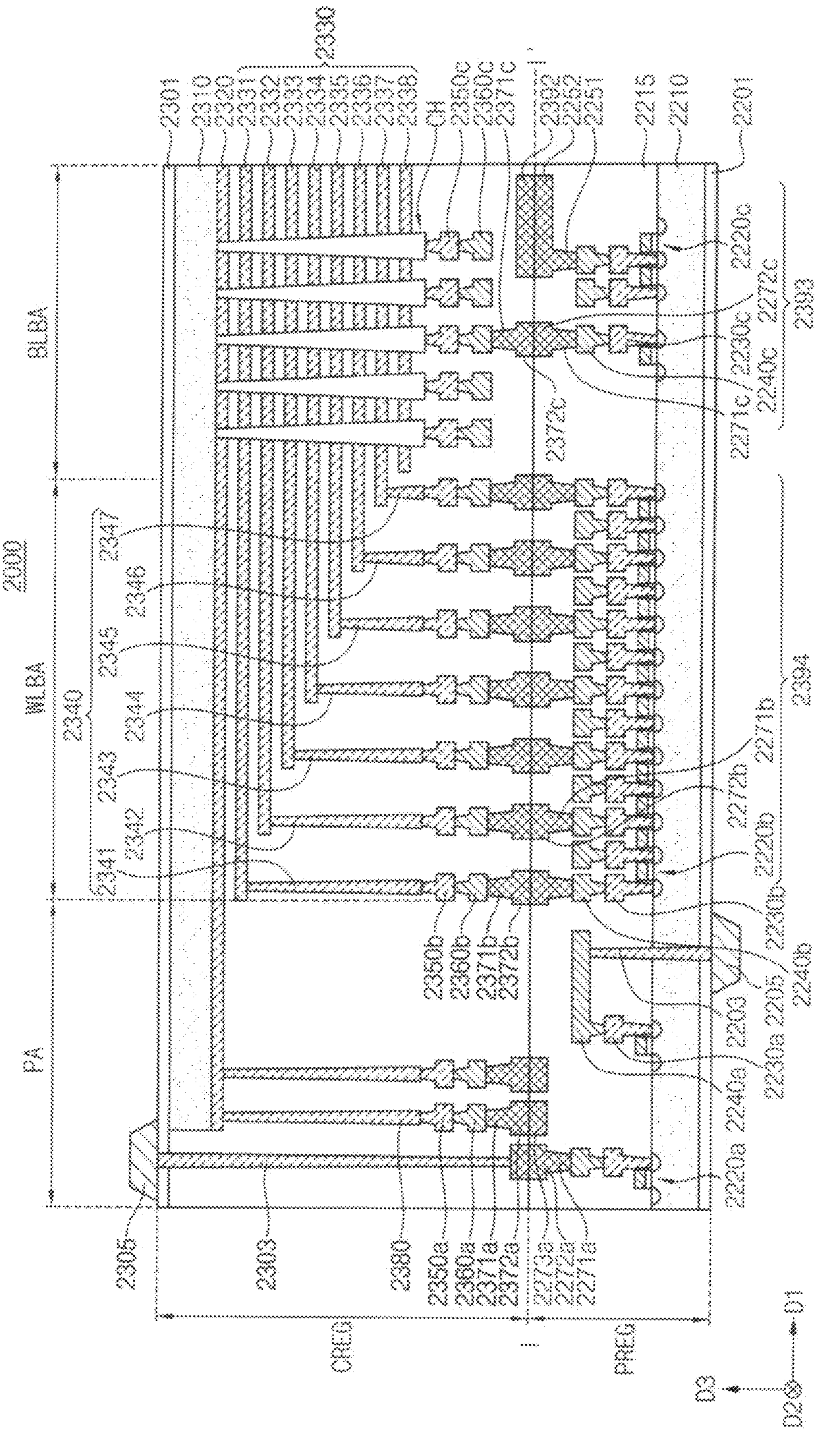
FIG. 36 is a cross-sectional diagram illustrating a nonvolatile memory device according to example embodiments.

FIG. 36 is a cross-sectional diagram illustrating a nonvolatile memory device according to example embodiments.

Referring to FIG. 36, a nonvolatile memory device 2000 may have a chip-to-chip (C2C) structure. Here, the term "C2C structure" denotes a structure in which an upper chip includes a memory cell region (e.g., the cell region CREG) on a first wafer, and a lower chip includes a peripheral circuit region (e.g., the peripheral region PREG) on a second wafer, in which the upper chip and the lower chip are bonded (or mounted) together at a bonding surface I-I'. In this regard, the bonding process may include a method of electrically connecting a bonding metal formed on an uppermost metal layer of the upper chip and a bonding metal formed on an uppermost metal layer of the lower chip. For example, when the bonding metals include copper (Cu), Cu-to-Cu bonding may be utilized. Example embodiments, however, are not limited thereto. For example, the bonding metals may also be formed of aluminum (Al) or tungsten (W).

Each of the peripheral region PREG and the cell region CREG of the nonvolatile memory device 2000 may include an external pad bonding area PA, a wordline bonding area WLBA, and a bitline bonding area BLBA.

The peripheral region PREG may include a first substrate 2210, an interlayer insulating layer 2215, circuit elements 2220*a*, 2220*b*, and 2220*c* formed on the first substrate 2210, first metal layers 2230*a*, 2230*b*, and 2230*c* respectively connected to the circuit elements 2220*a*, 2220*b*, and 2220*c*, and second metal layers 2240*a*, 2240*b*, and 2240*c* formed on the first metal layers 2230*a*, 2230*b*, and 2230*c*. In some embodiments, the first metal layers 2230*a*, 2230*b*, and 2230*c* may be formed of tungsten having relatively high electrical resistivity, and the second metal layers 2240*a*, 2240*b*, and 2240*c* may be formed of copper having relatively low electrical resistivity.

Although only the first metal layers 2230*a*, 2230*b*, and 2230*c* and the second metal layers 2240*a*, 2240*b*, and 2240*c* are shown and described in embodiments such as the embodiment of FIG. 36, example embodiments are not limited thereto. For example, in some embodiments, one or more additional metal layers may be further formed on the second metal layers 2240*a*, 2240*b*, and 2240*c*. At least a portion of the one or more additional metal layers formed on the second metal layers 2240*a*, 2240*b*, and 2240*c* may be formed of, for example, aluminum or the like having a lower electrical resistivity than those of copper forming the second metal layers 2240*a*, 2240*b*, and 2240*c*.

The interlayer insulating layer 2215 may be disposed on the first substrate 2210 and cover the circuit elements 2220*a*, 2220*b*, and 2220*c*, the first metal layers 2230*a*, 2230*b*, and 2230*c*, and the second metal layers 2240*a*, 2240*b*, and 2240*c*. The interlayer insulating layer 2215 may include an insulating material such as, for example, silicon oxide, silicon nitride, or the like.

Lower bonding metals 2271*b* and 2272*b* may be formed on the second metal layer 2240*b* in the wordline bonding area WLBA. In the wordline bonding area WLBA, the lower bonding metals 2271*b* and 2272*b* in the peripheral region PREG may be electrically bonded to upper bonding metals 2371*b* and 2372*b* of the cell region CREG. The lower bonding metals 2271*b* and 2272*b* and the upper bonding metals 2371*b* and 2372*b* may be formed of, for example, aluminum, copper, tungsten, or the like. The upper bonding metals 2371*b* and 2372*b* in the cell region CREG may be referred as first metal pads. The lower bonding metals 2271*b* and 2272*b* in the peripheral region PREG may be referred as second metal pads.

The cell region CREG may include at least one memory block. The cell region CREG may include a second substrate 2310 and a common source line 2320. On the second substrate 2310, wordlines 2331, 2332, 2333, 2334, 2335, 2336, 2337, and 2338 (collectively, 2330) may be vertically stacked (in the direction D3 or a Z-axis) perpendicular to an upper surface of the second substrate 2310. At least one string selection line and at least one ground selection line may be arranged on and below the wordlines 2330, respectively. The wordlines 2330 may be disposed between the at least one string selection line and the at least one ground selection line.

In the bitline bonding area BLBA, a channel structure CH may vertically extend perpendicular to the upper surface of the second substrate 2310, and pass through the wordlines 2330, the at least one string selection line, and the at least one ground selection line. The channel structure CH may include, for example, a data storage layer, a channel layer, a buried insulating layer, and the like. The channel layer may be electrically connected to a first metal layer 2350*c* and a second metal layer 2360*c*. For example, the first metal layer 2350*c* may be a bitline contact, and the second metal layer 2360*c* may be a bitline. In an example embodiment, the bitline (the second metal layer 2360*c*) may extend in a second horizontal direction D2 (e.g., a Y-axis direction) parallel to the upper surface of the second substrate 2310.

In the illustrated example of FIG. 36, an area in which the channel structure CH, the bitline (the second metal layer 2360*c*), and the like are disposed may be defined as the bitline bonding area BLBA. In the bitline bonding area BLBA, the bitline (the second metal layer 2360*c*) may be electrically connected to the circuit elements 2220*c* providing a page buffer 2393 in the peripheral region PREG. The bitline (the second metal layer 2360*c*) may be connected to upper bonding metals 2371*c* and 2372*c* in the cell region CREG, and the upper bonding metals 2371*c* and 2372*c* may be connected to lower bonding metals 2271*c* and 2272*c* connected to the circuit elements 2220*c* of the page buffer 2393.

In the wordline bonding area WLBA, the wordlines 2330 may extend in a first horizontal direction D1 (e.g., an X-axis direction) parallel to the upper surface of the second substrate 2310 and perpendicular to the second horizontal direction D2, and may be connected to cell contact plugs 2341, 2342, 2343, 2344, 2345, 2346, and 2347 (collectively, 2340). The wordlines 2330 and the cell contact plugs 2340 may be connected to each other in pads provided by at least a portion of the wordlines 2330 extending in different lengths in the first horizontal direction D1. A first metal layer 2350*b* and a second metal layer 2360*b* may be connected to an upper portion of the cell contact plugs 2340 connected to the wordlines 2330, sequentially. The cell contact plugs 2340 may be connected to the peripheral region PREG by the upper bonding metals 2371*b* and 2372*b* of the cell region CREG and the lower bonding metals 2271*b* and 2272*b* of the peripheral region PREG in the wordline bonding area WLBA.

The cell contact plugs 2340 may be electrically connected to the circuit elements 2220*b* forming a row decoder 2394 in the peripheral region PREG. In an example embodiment, operating voltages of the circuit elements 2220*b* forming the row decoder 2394 may be different than operating voltages of the circuit elements 2220*c* forming the page buffer 2393. For example, operating voltages of the circuit elements 2220*c* forming the page buffer 2393 may be greater than operating voltages of the circuit elements 2220*b* forming the row decoder 2394.

A common source line contact plug 2380 may be disposed in the external pad bonding area PA. The common source line contact plug 2380 may be formed of a conductive material such as, for example, a metal, a metal compound, polysilicon, or the like, and may be electrically connected to the common source line 2320. A first metal layer 2350*a* and a second metal layer 2360*a* may be stacked on an upper portion of the common source line contact plug 2380, sequentially. For example, an area in which the common source line contact plug 2380, the first metal layer 2350*a*, and the second metal layer 2360*a* are disposed may be defined as the external pad bonding area PA.

First I/O pad 2205 and second I/O pad 2305 may be disposed in the external pad bonding area PA. A lower insulating film 2201 covering a lower surface of the first substrate 2210 may be formed below the first substrate 2210. A first I/O pad 2205 may be formed on the lower insulating film 2201. The first I/O pad 2205 may be connected to at least one of the circuit elements 2220*a*, 2220*b*, and 2220*c* disposed in the peripheral region PREG through a first I/O contact plug 2203, and may be separated from the first substrate 2210 by the lower insulating film 2201. In addition, a side insulating film may be disposed between the first I/O contact plug 2203 and the first substrate 2210 to electrically separate the first I/O contact plug 2203 and the first substrate 2210.

An upper insulating film 2301 covering the upper surface of the second substrate 2310 may be formed on the second substrate 2310, and a second I/O pad 2305 may be disposed on the upper insulating film 2301. The second I/O pad 2305 may be connected to at least one of the circuit elements 2220*a*, 2220*b*, and 2220*c* disposed in the peripheral region PREG through a second I/O contact plug 2303. In some embodiments, the second I/O pad 2305 is electrically connected to a circuit element 2220*a*.

In some embodiments, the second substrate 2310 and the common source line 2320 are not disposed in an area in which the second I/O contact plug 2303 is disposed. Also, in some embodiments, the second I/O pad 2305 does not overlap the wordlines 2330 in the vertical direction D3 (e.g., the Z-axis direction). The second I/O contact plug 2303 may be separated from the second substrate 2310 in the direction parallel to the upper surface of the second substrate 310, and may pass through the interlayer insulating layer 2315 of the cell region CREG to be connected to the second I/O pad 2305.

According to embodiments, the first I/O pad 2205 and the second I/O pad 2305 may be selectively formed. For example, in some embodiments, the nonvolatile memory device 2000 may include only the first I/O pad 2205 disposed on the first substrate 2210 or the second I/O pad 2305 disposed on the second substrate 2310. Alternatively, in some embodiments, the nonvolatile memory device 2000 may include both the first I/O pad 2205 and the second I/O pad 2305.

A metal pattern provided on an uppermost metal layer may be provided as a dummy pattern or the uppermost metal layer may be absent, in each of the external pad bonding area PA and the bitline bonding area BLBA, respectively included in the cell region CREG and the peripheral region PREG.

In the external pad bonding area PA, the nonvolatile memory device 2000 may include a lower metal pattern 2273*a*, corresponding to an upper metal pattern 2372*a* formed in an uppermost metal layer of the cell region CREG, and having the same cross-sectional shape as the upper metal pattern 2372*a* of the cell region CREG so as to be connected to each other, in an uppermost metal layer of the peripheral region PREG. In some embodiments, in the peripheral region PREG, the lower metal pattern 2273*a* formed in the uppermost metal layer of the peripheral region PREG is not connected to a contact. In similar manner, in the external pad bonding area PA, an upper metal pattern 2372*a*, corresponding to the lower metal pattern 2273*a* formed in an uppermost metal layer of the peripheral region PREG, and having the same shape as a lower metal pattern 2273*a* of the peripheral region PREG, may be formed in an uppermost metal layer of the cell region CREG.

The lower bonding metals 2271*b* and 2272*b* may be formed on the second metal layer 2240*b* in the wordline bonding area WLBA. In the wordline bonding area WLBA, the lower bonding metals 2271*b* and 2272*b* of the peripheral region PREG may be electrically connected to the upper bonding metals 2371*b* and 2372*b* of the cell region CREG by, for example, Cu-to-Cu bonding.

Further, in the bitline bonding area BLBA, an upper metal pattern 2392, corresponding to a lower metal pattern 2252 formed in the uppermost metal layer of the peripheral region PREG, and having the same cross-sectional shape as the lower metal pattern 2252 of the peripheral region PREG, may be formed in an uppermost metal layer of the cell region CREG. In some embodiments, a contact is not formed on the upper metal pattern 2392 formed in the uppermost metal layer of the cell region CREG.

Figure 37:
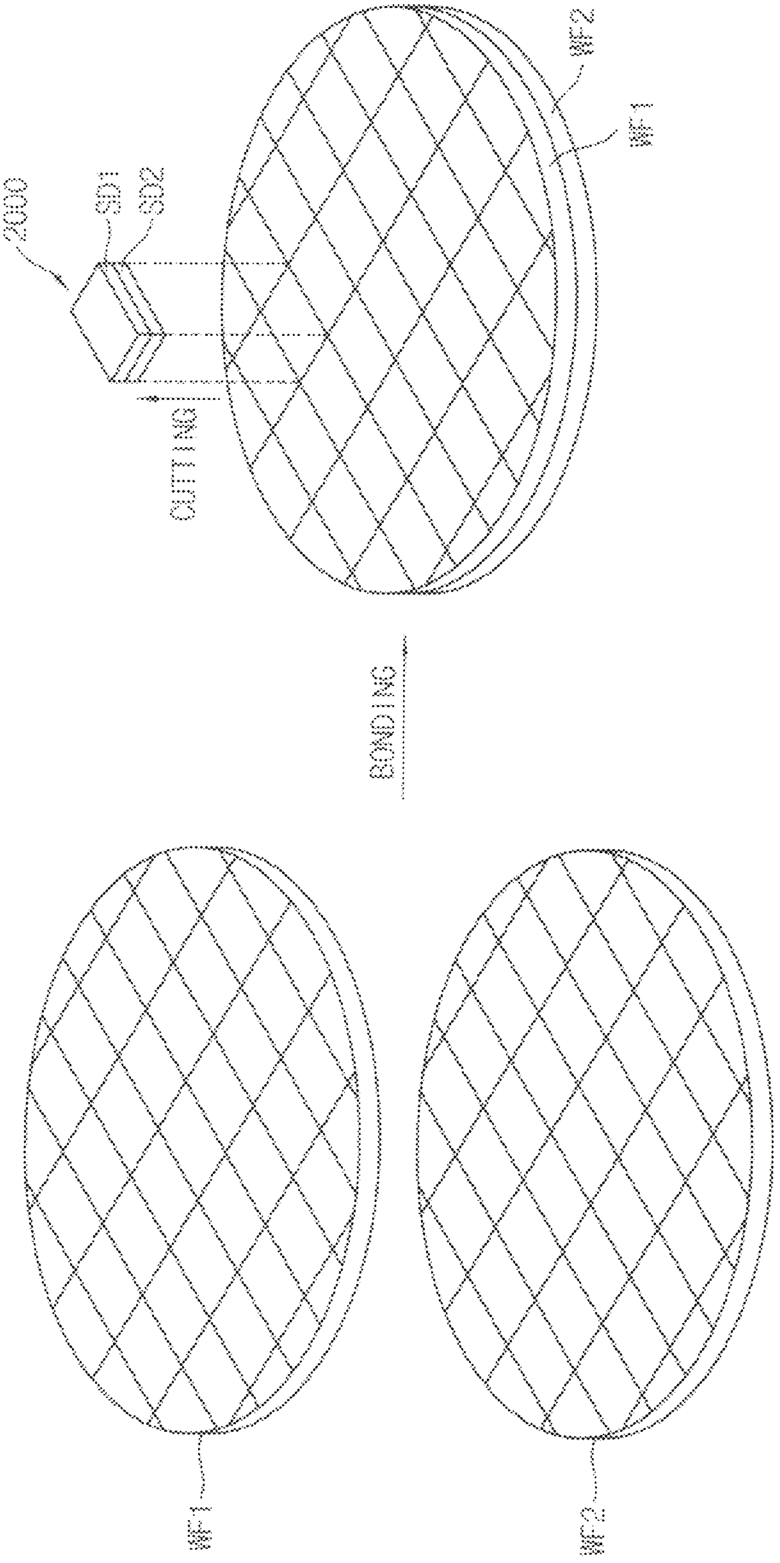
FIG. 37 is a conceptual diagram illustrating manufacturing processes of a stacked semiconductor device according to example embodiments.

FIG. 37 is a conceptual diagram illustrating manufacturing processes of a stacked semiconductor device according to example embodiments.

Referring to FIG. 37, respective integrated circuits may be formed on a first wafer WF1 and a second wafer WF2. The memory cell array may be formed in the first wafer WF1 and the peripheral circuits may be formed in the second wafer WF2.

After the various integrated circuits have been respectively formed on the first wafer WF1 and the second wafer WF2, the first wafer WF1 and the second wafer WF2 may be bonded together. The bonded wafers WF1 and WF2 may then be cut (or divided) into separate chips, in which each chip corresponds to a semiconductor device such as, for example, the nonvolatile memory device 2000, including a first semiconductor die SD1 and a second semiconductor die SD2 that are stacked vertically (e.g., the first semiconductor die SD1 is stacked on the second semiconductor die SD2, etc.). Each cut portion of the first wafer WF1 corresponds to the first semiconductor die SD1 and each cut portion of the second wafer WF2 corresponds to the second semiconductor die SD2.

Figure 38:
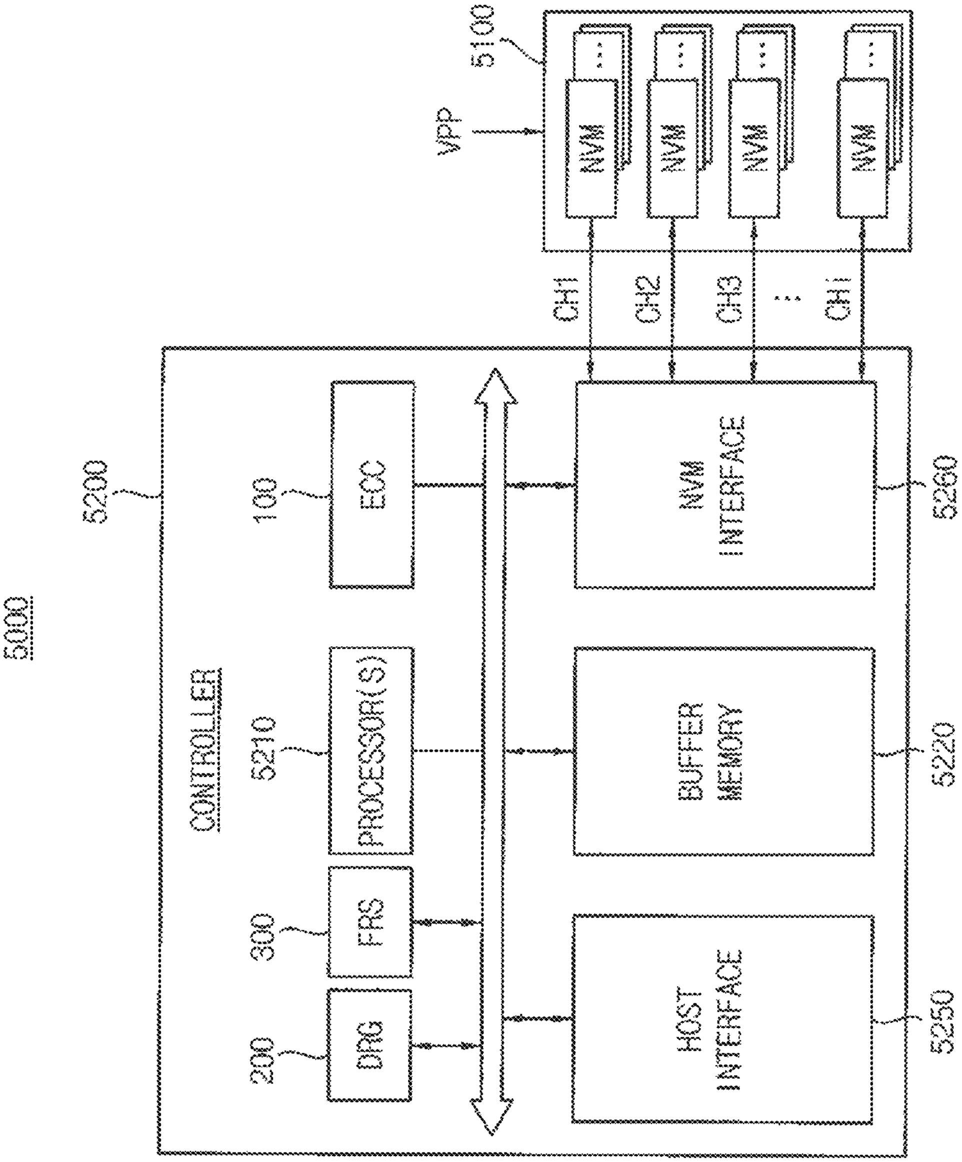
FIG. 38 is a block diagram illustrating a solid state or solid state drive (SSD) according to example embodiments.

FIG. 38 is a block diagram illustrating a solid state or solid state drive (SSD) according to example embodiments.

Referring to FIG. 38, an SSD 5000 may generally include nonvolatile memory devices 5100 and an SSD controller 5200.

The nonvolatile memory devices 5100 may (optionally) be configured to receive a high voltage VPP. One or more of the nonvolatile memory devices 5100 may be provided as memory device(s) according to example embodiments described above.

The SSD controller 5200 is connected to the nonvolatile memory devices 5100 via multiple channels CH1, CH2, CHI3, . . . Chi, in which i is a natural number. The SSD controller 1200 may include one or more processors 5210, a buffer memory 5220, an ECC engine 100 (error correction code engine), a data regenerator 200 (DRG), a flip range setter 300 (FRS), a host interface 5250, and a nonvolatile memory interface 5260. The buffer memory 5220 stores data used to drive the SSD controller 5200. The buffer memory 5220 includes multiple memory lines, each storing data or a command. The ECC circuit 5230 calculates error correction code values of data to be programmed at a writing operation, and corrects an error of read data using an error correction code value at a read operation. In a data recovery operation, The ECC circuit 5230 corrects an error of data recovered from the nonvolatile memory devices 5100.

As described above, the flip range setter 300 may set the flip range based on the distribution data such as the cell count information. The data regenerator 200 may generate the corrected read data by inverting the error candidate bits, which are included in the flip range, among the bits of the normal read data. The ECC engine 100 may perform the second ECC decoding with respect to the corrected read data when the first ECC decoding with respect to the normal read data results in failure.

As described above, the method of ECC decoding and the memory system according to example embodiments may efficiently enhance error correction capability by retrying ECC decoding based on the corrected read data when ECC decoding based on the normal read data is failed such that the corrected read data are generated by inverting the values of the error candidate bits corresponding to the higher probability of errors. Through the enhanced error correction capability, reliability and performance of the nonvolatile memory device and the memory system may be enhanced.

Example embodiments may be applied to any electronic devices and systems including a nonvolatile memory device. For example, example embodiments may be applied to systems such as a memory card, a solid state drive (SSD), an embedded multimedia card (eMMC), a universal flash storage (UFS), a mobile phone, a smartphone, a personal digital assistant (PDA), a portable multimedia player (PMP), a digital camera, a camcorder, a personal computer (PC), a server computer, a workstation, a laptop computer, a digital TV, a set~top box, a portable game console, a navigation system, a wearable device, an Internet of Things (IoT) device, an Internet of Everything (IoE) device, an e-book, a virtual reality (VR) device, an augmented reality (AR) device, a server system, an automotive driving system, etc.

The foregoing is illustrative of example embodiments and is not to be construed as limiting thereof. Although a few example embodiments have been described, those skilled in the art will readily appreciate that many modifications are possible in the example embodiments without materially departing from the inventive concept(s) described herein.

What is claimed is:

1. A memory controller configured to control operations of a nonvolatile memory device, the memory controller comprising:

a flip range setter configured to set a flip range based on distribution data indicating degeneration degree of retention characteristics of the nonvolatile memory device;

a data regenerator configured to, when a first error correction code (ECC) decoding with respect to normal read data results in failure, generate corrected read data based on flip read data by inverting error candidate bits included in the flip range of a threshold voltage among bits of the normal read data, wherein the normal read data are read from the nonvolatile memory device based on normal read voltages, and the flip read data are read out from the nonvolatile memory device based on flip read voltages corresponding to the flip range; and an ECC decoder configured to perform the first ECC decoding with respect to the normal read data and perform a second ECC decoding with respect to the corrected read data when the first ECC decoding results in failure.

2. The memory controller of claim 1, wherein the data regenerator includes:

a plurality of unit circuits configured to perform a bitwise logic operation on the normal read data and the flip read data to generate the corrected read data.

3. The memory controller of claim 2, wherein each unit circuit of the plurality of unit circuits includes:

an inverter configured to invert each bit of the flip read data; and an XOR logic gate configured to perform an XOR operation on an output of the inverter and each bit of the normal read data.

4. The memory controller of claim 2, wherein the flip read data include high flip read data that are read based on a high flip read voltage higher than a hard-decision read voltage, and low flip read data that are read based on a low flip read voltage lower than the hard-decision read voltage.

5. The memory controller of claim 4, wherein each unit circuit of the plurality of unit circuits includes:

a first inverter configured to invert each bit of the high flip read data;

a second inverter configured to invert each bit of the low flip read data;

a first XOR logic gate configured to perform an XOR operation on an output of the first inverter and each bit of the normal read data;

a second XOR logic gate configured to perform an XOR operation on an output of the second inverter and each bit of the normal read data; and a multiplexer configured to select one of an output of the first XOR logic gate and an output of the second XOR logic gate to output each bit of the corrected read data.

6. The memory controller of claim 1, wherein the normal read data include hard-decision data that are read based on a hard-decision read voltage included in the normal read voltages and indicate data stored in the nonvolatile memory device, and wherein the data regenerator is configured to generate corrected hard-decision data based on the flip read data by inverting the error candidate bits included in the flip range among bits of the hard-decision data.

7. The memory controller of claim 6, wherein the data regenerator is configured to generate the corrected hard-decision data based on a following bitwise logic operation, HD'[i]=HD[i]XOR~FD[i], where HD'[i] indicates each bit of the corrected hard-decision data, HD[i] indicates each bit of the hard-decision data, FD[i] indicates each bit of the flip read data, "XOR" indicates an exclusive OR logic operation, and "~" indicates an inversion logic operation.

8. The memory controller of claim 6, wherein the normal read data further include soft-decision data that are read based on soft-decision read voltages included in the normal read voltages and indicate reliability of the hard-decision data, and wherein the data regenerator is configured to generate corrected soft-decision data based on the flip read data by inverting the error candidate bits included in the flip range among bits of the soft-decision data.

9. The memory controller of claim 8, wherein the soft-decision data is 3-bit soft-decision data and the data regenerator is configured to generate the corrected soft-decision data based on a following bitwise logic operation, $$SDL'[i] = (SDH[i] \text{ AND } SDL[i] \text{ AND } FD[i]) XOR(\sim SDH[i] \text{ AND } SDL[i] \text{ AND} \sim FD[i])$$

where SDL'[i] indicates each lower bit of the corrected soft-decision data, SDH[i] indicates each higher bit of the soft-decision data, FD[i] indicates each bit of the flip read data, "AND" indicates an AND logic operation, "XOR" indicates an exclusive OR logic operation, and "~" indicates an inversion logic operation.

10. The memory controller of claim 1, wherein the flip range setter is configured to set a plurality of flip ranges based on the distribution, and wherein the data regenerator is configured to sequentially generate each of a plurality of corrected data respectively corresponding to the plurality of flip ranges to sequentially perform the second ECC decoding with respect to each of the plurality of corrected data, until the second ECC decoding with respect to the corrected read data results in success.

11. The memory controller of claim 10, wherein the flip range setter is configured to determine an order of generating the plurality of corrected data respectively corresponding to the plurality of flip ranges based on the distribution data.

12. The memory controller of claim 1, wherein the flip range setter is configured to set at least one of a position and a magnitude of the flip range based on the distribution data.

13. A memory controller configured to control operations of a nonvolatile memory device, the memory controller comprising:

a data regenerator configured to, when a first error correction code (ECC) decoding with respect to normal read data results in failure, generate corrected read data based on flip read data by inverting error candidate bits included in a flip range of a threshold voltage among bits of the normal read data, wherein the normal read data are read from the nonvolatile memory device based on normal read voltages, and the flip read data are read out from the nonvolatile memory device based on flip read voltages corresponding to the flip range; and an ECC decoder configured to perform the first ECC decoding with respect to the normal read data and perform a second ECC decoding with respect to the corrected read data when the first ECC decoding results in failure, wherein the normal read data include hard-decision data that are read based on a hard-decision read voltage included in the normal read voltages and indicate data stored in the nonvolatile memory device, and wherein the data regenerator is configured to generate corrected hard-decision data based on the flip read data by inverting the error candidate bits included in the flip range among bits of the hard-decision data.

14. The memory controller of claim 13, wherein the flip read data include high flip read data that are read based on a high flip read voltage higher than the hard-decision read voltage, and wherein the data regenerator is configured to:

perform a bitwise logic operation on the hard-decision data and the high flip read data; and invert the error candidate bits to generate the corrected hard-decision data, where the error candidate bits are included in the flip range between the hard-decision read voltage and the high flip read voltage.

15. The memory controller of claim 13, wherein the flip read data include low flip read data that are read based on a low flip read voltage lower than the hard-decision read voltage, and wherein the data regenerator is configured to:

perform a bitwise logic operation on the hard-decision data and the low flip read data; and invert the error candidate bits to generate the corrected hard-decision data, where the error candidate bits are included in the flip range between the hard-decision read voltage and the low flip read voltage.

16. The memory controller of claim 13, wherein the flip read data include high flip read data that are read based on a high flip read voltage higher than the hard-decision read voltage, and low flip read data that are read based on a low flip read voltage lower than the hard-decision read voltage.

17. The memory controller of claim 16, wherein the data regenerator is configured to:

perform a first bitwise logic operation on the hard-decision data and the high flip read data and a second bitwise logic operation on the hard-decision data and the low flip read data; and invert the error candidate bits to generate the corrected hard-decision data, where the error candidate bits are included in a high flip range between the hard-decision read voltage and the high flip read voltage and a low flip range between the hard-decision read voltage and the low flip read voltage.

18. The memory controller of claim 13, further comprising:

a flip range setter configured to set the flip range based on distribution data indicating degeneration degree of retention characteristics of the nonvolatile memory device.

19. The memory controller of claim 18, wherein setting flip range setter is configured to set at least one of a position and a magnitude of the flip range based on the distribution data.

20. A method of error correction code (ECC) decoding of a memory controller that controls a nonvolatile memory device, the method comprising:

reading normal read data from a nonvolatile memory device based on normal read voltages;

performing a first ECC decoding with respect to the normal read data;

when the first ECC decoding results in failure, reading flip read data from the nonvolatile memory device based on flip read voltages corresponding to a flip range of a threshold voltage;

generating corrected read data based on the flip read data by inverting error candidate bits included in the flip range among bits of the normal read data; and performing a second ECC decoding with respect to the corrected read data, wherein the normal read data include hard-decision data that are read based on a hard-decision read voltage included in the normal read voltages and indicate data stored in the nonvolatile memory device, and wherein generating the corrected read data includes:

generating corrected hard-decision data based on the flip read data by inverting the error candidate bits included in the flip range among bits of the hard-decision data.

* * * * *